(12) United States Patent
Nakatani

(10) Patent No.: US 6,903,459 B2
(45) Date of Patent: Jun. 7, 2005

(54) HIGH FREQUENCY SEMICONDUCTOR DEVICE

(75) Inventor: Toshifumi Nakatani, Osaka (JP)

(73) Assignee: Matsushita ELectric Industrial Co., Ltd., Osaka (JP)

( * ) Notice: Subject to any disclaimer, the term of this patent is extended or adjusted under 35 U.S.C. 154(b) by 47 days.

(21) Appl. No.: 10/147,067

(22) Filed: May 17, 2002

(65) Prior Publication Data

US 2002/0171115 A1 Nov. 21, 2002

(30) Foreign Application Priority Data

May 17, 2001 (JP) ..................... P2001-147612

(51) Int. Cl.$^7$ .......... H01L 23/48; H01L 23/52; H01L 29/40
(52) U.S. Cl. .......... 257/758; 257/499; 257/750; 257/759; 257/760
(58) Field of Search .......... 257/499, 758–760, 257/750

(56) References Cited

U.S. PATENT DOCUMENTS

| | | | | |
|---|---|---|---|---|
| 3,798,059 | A | * 3/1974 | Astle et al. | 336/229 |
| 4,833,521 | A | 5/1989 | Early | 257/664 |
| 5,446,311 | A | * 8/1995 | Ewen et al. | 257/531 |
| 6,016,000 | A | * 1/2000 | Moslehi | 257/522 |
| 6,097,273 | A | * 8/2000 | Frye et al. | 336/200 |
| 6,303,423 | B1 | * 10/2001 | Lin | 438/238 |
| 6,316,833 | B1 | * 11/2001 | Oda | 257/758 |
| 6,326,692 | B1 | * 12/2001 | Pangrle et al. | 257/758 |
| 6,348,391 | B1 | * 2/2002 | Fattaruso | 438/381 |
| 2002/0008605 | A1 | * 1/2002 | Gardner | 336/200 |

OTHER PUBLICATIONS

Cheon Soo Kim et al., "Gate Layout and Bonding Pad Structure of a RF n–MOSFET for Low Noise Performance", IEEE Electron Device Letters, Vo. 21, No. 12, Dec. 2000, pp. 607–609.

John T. Colvin et al., "A Bond–Pad Structure for Reducing Effects of Substrate Resistance on LNA Performance in a Silicon Bipolar Technology", IEEE, pp. 109–112.

* cited by examiner

Primary Examiner—Amir Zarabian
Assistant Examiner—Ida M. Soward
(74) Attorney, Agent, or Firm—McDermott Will & Emery LLP

(57) ABSTRACT

A high frequency (HF) semiconductor device includes a semiconductor substrate. An electroconductor layer is provided on the semiconductor substrate. A first insulator layer electrically insulates the electroconductor layer from the semiconductor substrate. N pieces of wires are provided on the semiconductor substrate, and N-phase signals (where N represents a positive integer greater than 2) are fed to the wires. A second insulator layer electrically insulates the wires from the electroconductor layer and the semiconductor substrate. $N_1$ pieces of the wires are provided on one side of the electroconductor layer (where $N_1$ represents 0 or a positive integer equaling or less than N). $N_2$ pieces of the wires are provided on the other side of the electroconductor layer (where $N_2$ represents 0 or a positive integer satisfying $N_1+N_2=N$).

34 Claims, 17 Drawing Sheets

SYMMETRY PLANE

SYMMETRY PLANE

SYMMETRY PLANE

F I G. 5
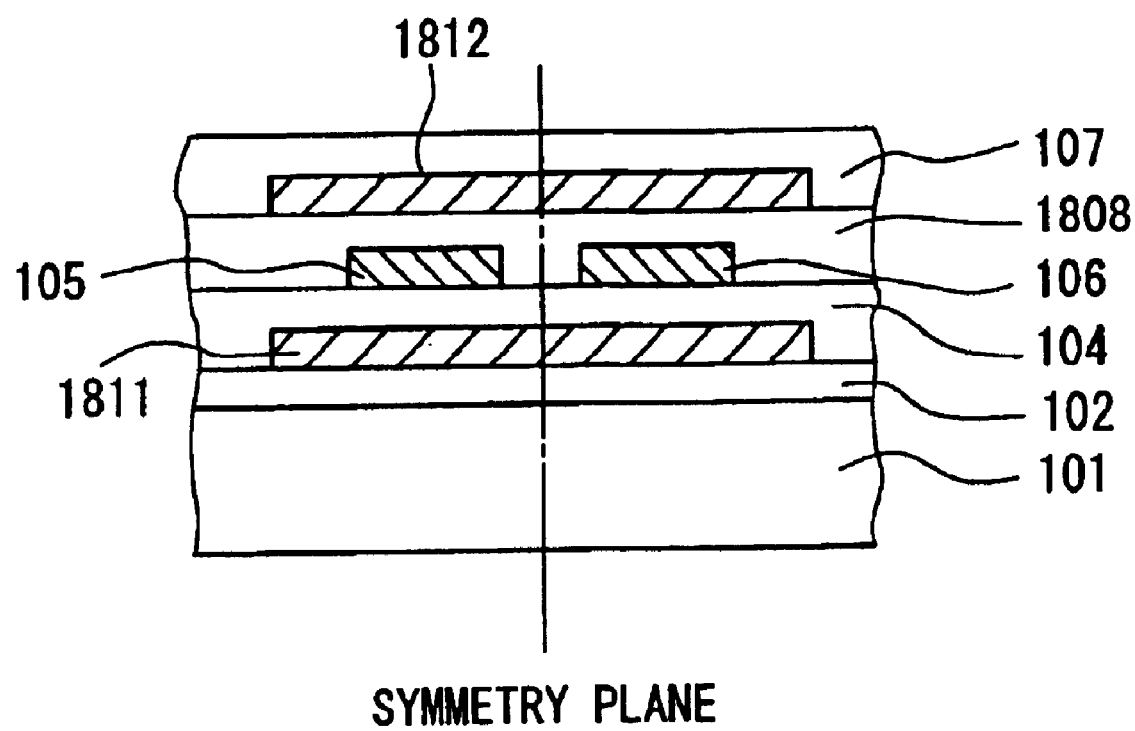
SYMMETRY PLANE

F I G. 10
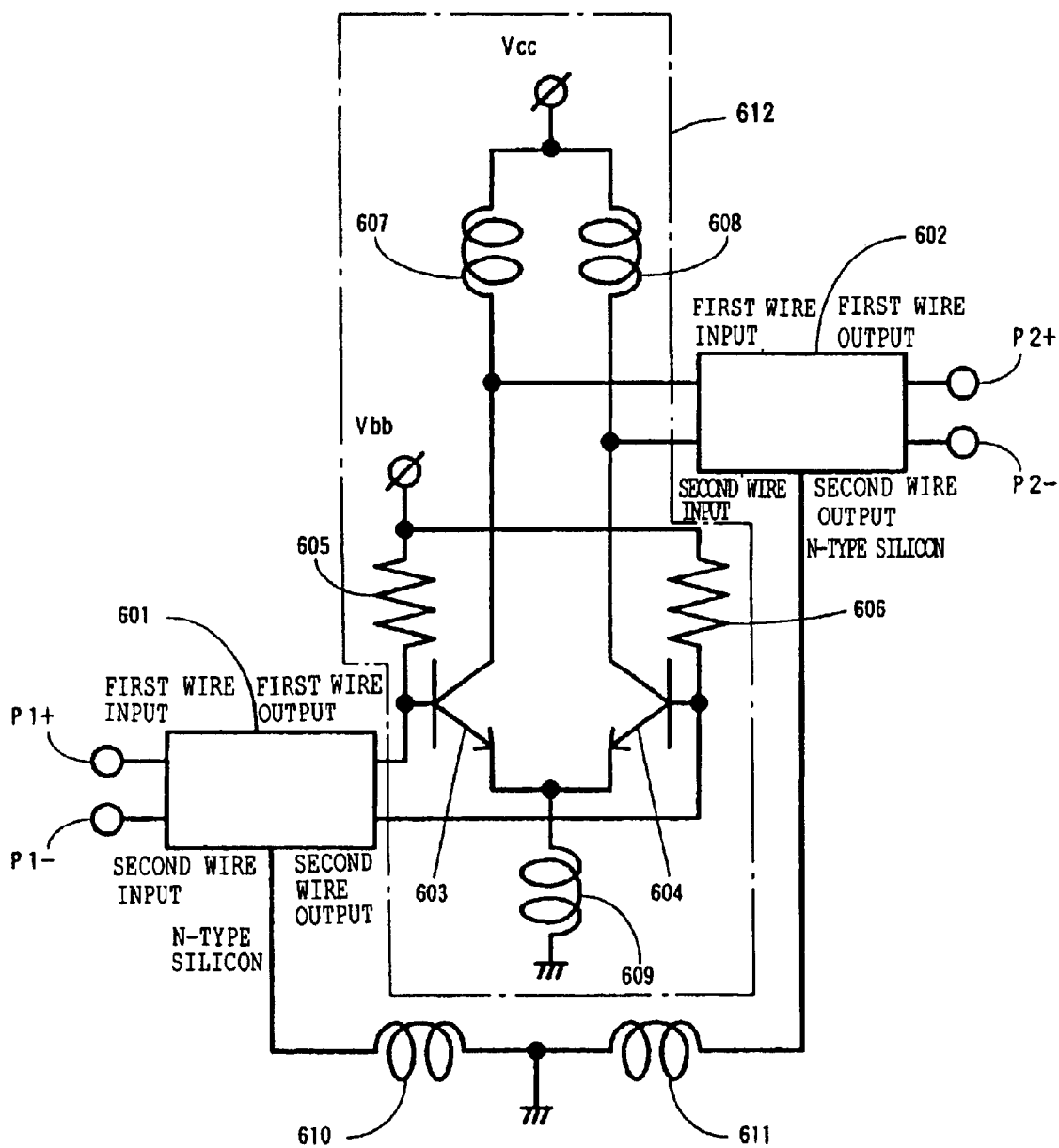

F I G. 11
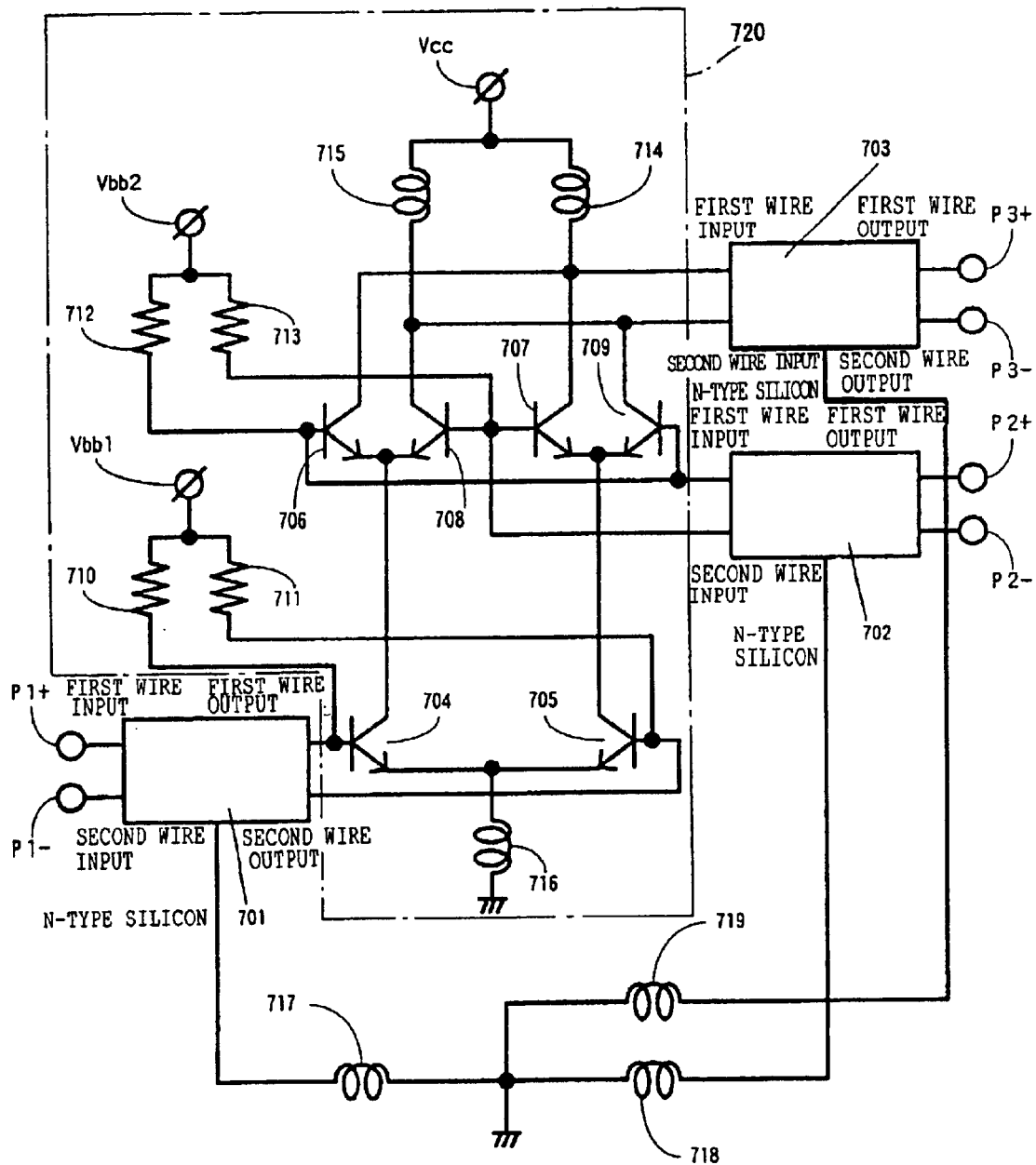

SYMMETRY PLANE

SYMMETRY PLANE

SYMMETRY PLANE

SYMMETRY PLANE

PRIOR ART

HIGH FREQUENCY SEMICONDUCTOR DEVICE

FIELD OF THE INVENTION

The present invention relates to a high frequency (HF) semiconductor device formed on an electroconductive semiconductor substrate. More specifically, the present invention relates to an HF semiconductor device formed on a silicon substrate.

BACKGROUND OF THE INVENTION

In the recent wide use of mobile terminals represented by, for example, a mobile handset, demands are increasing for an HF semiconductor device operable at a high frequency of 1 GHz or higher. Conventionally, a gallium arsenide substrate is used for the HF frequency semiconductor device. However, the gallium arsenide substrate is expensive, so that using the gallium arsenide substrate makes it difficult in implementing reduction in cost for the HF semiconductor device. In addition, the gallium arsenide substrate makes it difficult to implement the improvement in integration of the HF semiconductor device.

In comparison to the above, while a silicon substrate with transistors formed thereon is inexpensive, there has been a difficulty in driving the transistors to sufficiently operate at an HF band. However, according to, for example, the advanced microfabrication technologies for silicon semiconductors, even HF semiconductor devices using a silicon substrate are expected to reach a level that satisfies specifications necessary for mobile terminals. It is now considered whether HF semiconductor using silicon substrate can be used for semiconductor device having high frequency of 1 GHz or more.

Among problems in mounting an HF semiconductor device on a silicon substrate is a problem of a signal loss occurring with a silicon substrate. The loss occurs because the silicon substrate is formed of an electroconductive substrate that allows a relatively high current to flow. However, since the gallium arsenide substrate is formed of a high resistant substrate, the aforementioned problem does not occur therewith.

Hereinbelow, the aforementioned signal loss will be described in detail with reference to FIGS. 16A and 16B. FIG. 16A is a plan view of a prior-art HF semiconductor device; and FIG. 16B is a cross sectional view taken along the line A–A' of FIG. 16A.

Referring to the above-referenced drawings, numeral 901 denotes a doped electroconductive p-type silicon substrate, numeral 902 denotes an insulator layer formed of an $SiO_2$ insulator film or the like, 903 denotes a bonding pad necessary for coupling a bonding wire, numeral 904 denotes a wire for coupling devices such as a pad and a transistor, and numeral 905 denotes a protection layer.

The bonding pad 903 and the wire 904 are each formed of, for example, one of a metal film made of, for example, Al or Cu. The insulator layer 902 covers the surface of the p-type silicon substrate 901. The bonding pad 903 and the wire 904 are formed on the surface of the insulator layer 902. The protection layer 905 is formed on the surfaces of the bonding pad 903 and the wire 904. In addition, the p-type silicon substrate 901 is connected to a ground node (not shown).

In the configuration of the prior-art HF semiconductor device shown in FIGS. 16A and 16B, an HF signal flowing through the bonding pad 903 and the wire 904 leaks to the silicon substrate 901 via parasitic capacitance of the insulator layer 902. As such, resistant components of the p-type silicon substrate 901 cause a loss by the signal leakage.

A known prior-art example HF semiconductor devices capable of reducing a loss occurring in a silicon substrate as described above is described in "A bond-pad structure for reducing effects of substrate resistance on LNA performance in a silicon bipolar technology", Proc. 1998 IEEE BTCM.

FIGS. 17A and 17B shows another prior-art HF semiconductor device. FIG. 17A is a plan view of the HF semiconductor device; and FIG. 17B is a cross sectional view taken along the line A–A' of FIG. 17A. Portions corresponding to those shown in FIGS. 16A and 16B are shown with the same reference numerals. Numeral 1011 denotes an n-type silicon layer having a doping concentration that is about double-digit higher than that of the p-type silicon substrate 901. Numerals 1012 and 1013 denote wires provided for coupling the n-type silicon layer 1011 to a ground potential.

The n-type silicon layer 1011 is formed on the surface of a p-type silicon substrate 901. An insulator layer 902 covers the n-type silicon layer 1011 and the p-type silicon substrate 901. However, in the covering process, terminal portions 1011a and 1011b of the n-type silicon layer 1011 are not covered and are exposed to the surface of the insulator layer 902.

A bonding pad 903 and wires 904, 1012, and 1013 are formed on the surface of the insulator layer 902. A protection layer 905 is formed on upper surfaces of the bonding pad 903 and the wires 904, 1012, and 1013. The terminal portions 1011a and 1011b are connected to the n-type silicon layer 1011. The wires 1012 and 1013 are connected to a ground potential. The p-type silicon substrate 901 is isolated from the n-type silicon layer 1011 via a depletion layer provided as a p-n junction. The p-type silicon substrate 901 is connected to a ground potential (not shown).

In the configuration shown in FIGS. 17A and 17B, an HF signal leaked from bonding pad 903 through a parasitic capacitance of the insulator layer 902 flows to the ground potential via the n-type silicon layer 1011 and the wires 1012 and 1013. The resistant component of each of n-type silicon layer and the wires 1012 and 1013 is very smaller than that of the silicon substrate 901. Consequently, the HF-signal loss is reduced in the configuration shown in FIGS. 17A and 17B.

However, as shown in FIG. 18, in the prior-art HF semiconductor devices, an increase in frequency involves an increase in the influence of a parasitic inductance Ls occurring in, for example, the wire 1012,1013. This causes the n-type silicon layer 1011 to be isolated in high frequency from the ground. As such, the HF signal leaked from the n-type silicon layer 1011 does not flow to the ground potential, but it flows to the p-type silicon substrate 901. In this case, the resistant component of the p-type silicon substrate 901 causes a loss of the signal component.

SUMMARY OF THE INVENTION

In view of the above, an object of the present invention is to provide an HF semiconductor device in which the loss attributable to leakage of a high-frequency (HF) signal is reduced. Another object of the present invention is to provide a high-frequency semiconductor circuit (which hereinbelow will be referred to as an "HF semiconductor circuit") using the HF semiconductor device.

Other objects, features, and advantages will become apparent from the detailed description given below.

The present invention is summarized as follows.

According to one aspect of the present invention, a high frequency (HF) semiconductor device includes a semiconductor substrate, an electroconductor layer provided on the semiconductor substrate, a first insulator layer for electrically insulating the electroconductor layer from the semiconductor substrate, N pieces of wires which are provided on the semiconductor substrate and to which N-phase signals are fed (where N represents a positive integer greater than 2), and a second insulator layer for electrically insulate the wires from the electroconductor layer and the semiconductor substrate. In addition, $N_1$ pieces of the wires are provided on one side of the electroconductor layer (where $N_1$ represents 0 or a positive integer equaling or less than N). Moreover, $N_2$ pieces of the wires are provided on the other side of the electroconductor layer (where $N_2$ represents 0 or a positive integer satisfying $N_1+N_2=N$).

In the HF semiconductor device, the electroconductor layer exhibits the following operations. In this case, the electroconductor layer functions as a shield with respect to the wires opposing the semiconductor substrate via the electroconductor layer therebetween. In addition, the electroconductor layer offers a function of concentrating electrofields of signals flowing through the wires. As such, the anti-leakage property is increased to prevent signals (HF signals) from leaking from the wires. This reduces the loss of the HF signal that occurs because of a resistant component of the semiconductor substrate. These operations are most effective when the wires are disposed to oppose the electroconductor layer.

In the HF semiconductor device, an HF-signal isolating section is preferably provided between the electroconductor layer and a ground to isolate an HF component flowing between the electroconductor layer and the ground.

The signal isolating section is preferably an insulator. In this case, the electroconductor layer functions as a shield. This configuration therefore reduces the leakage of differential signals, which flow to the wires, to the semiconductor substrate. Consequently, the configuration reduces the loss of the differential signals that occurs because of a resistant component of the semiconductor substrate.

Alternatively, the signal isolating section is preferably a resistor. In this case, the electroconductor layer functions as a ground potential. This configuration therefore attenuates common signals that leak to the semiconductor substrate from the wires. Consequently, the configuration reduces the loss of the HF signals that occurs because of a resistant component of the semiconductor substrate.

Still alternatively, the signal isolating section is preferably an inductor. In this case, the electroconductor layer functions as a ground potential. This configuration therefore attenuates common signals that leak to the semiconductor substrate from the wires. Consequently, the configuration reduces the loss of the common signals that occurs because of a resistant component of the semiconductor substrate.

Still alternatively, the signal isolating section is preferably formed to comprise an inductor and a capacitor that are in parallel connected, and a resonant frequency of the signal isolating section is in the same frequency band of the signal fed to each of the wires. In this case, the electroconductor layer functions as a ground potential. This configuration therefore attenuates common signals that leak to the semiconductor substrate from the wires. Consequently, the configuration reduces the loss of the HF signals that occurs because of a resistant component of the semiconductor substrate.

Still alternatively, the signal isolating section is preferably a distributed-constant line having a line-length equivalent to an odd multiple of one quarter of a wavelength of the signal fed to each of the wires. In this case, the electroconductor layer functions as a ground potential. This configuration therefore attenuates common signals that leak to the semiconductor substrate from the wires. Consequently, the configuration reduces the loss of the HF signals that occurs because of a resistant component of the semiconductor substrate.

The electroconductor layer is preferably formed of one of metal, p-type doped polysilicon, and n-type doped polysilicon. In this case, the electroconductor layer functions as a shield. This configuration therefore reduces the leakage of differential signals, which flow to the wires, to the semiconductor substrate. Consequently, the configuration reduces the loss of the differential signals that occurs because of a resistant component of the semiconductor.

Alternatively, the electroconductor layer is preferably an electroconductive silicon layer that is different from the semiconductor. In this case, the electroconductor layer functions as a shield. This configuration therefore reduces the leakage of differential signals, which flow to the wires, to the semiconductor substrate. Consequently, the configuration reduces the loss of the differential signals that occurs because of a resistant component of the semiconductor.

Preferably, an inductor is connected between the wires. In this case, parasitic capacitances occurring between the wires and the electroconductor layer are offset by the inductor. Thereby, the phase delay between the differential signals flowing to the wires is improved. Consequently, the configuration reduces the loss of the signals (HF signals) that occurs because of a resistant component of the semiconductor substrate.

According to the present invention, an HF semiconductor circuit includes a plurality of the HF semiconductor devices, wherein the electroconductor layers of the individual HF semiconductor devices are connected to one another via the HF-signal isolating section provided to isolate the HF component flowing between the electroconductor layer and the ground.

The HF semiconductor circuit exhibits the following operations. The HF semiconductor circuit is capable of reducing the flow of a signal, which has leaked from each of the wires of each of the HF semiconductor device, to different one of the HF semiconductor devices via the electroconductor layer. This reduces the loss of the signals (HF signals) that occurs because of a resistant component of the semiconductor substrate.

Preferably, the HF semiconductor circuit has a configuration that includes at least two units of the HF semiconductor devices, and a switch circuit section. In the configuration, the HF semiconductor devices are connected via the switch circuit section. The switch circuit section performs control electrically isolate the HF semiconductor devices from each other according to a control voltage. This configuration enables a low-loss HF differential switch circuit to be implemented.

Alternatively, it is preferable that the HF semiconductor circuit have a configuration that includes at least two units of the HF semiconductor devices, and an amplifying circuit section. In the configuration, the HF semiconductor devices are connected via the amplifying circuit section. The amplifying circuit section amplifies a signal input from the one HF semiconductor device and outputs the signal to the other HF semiconductor device. The configuration enables the implementation of a stabilized differential amplifier circuit featured by low noise and a low output-power loss.

Still alternatively, the HF semiconductor circuit preferably has a configuration that includes at least three units of the HF semiconductor devices, and a frequency converter circuit section. In the configuration, the HF semiconductor devices are connected via the frequency converter circuit section. The frequency converter circuit section performs a frequency conversion of a signal input from each of the two HF semiconductor devices and outputs the signal to the other HF semiconductor device. The configuration enables the implementation of a differential frequency converter circuit featured by low noise, a low output-power loss, and good isolation.

Still alternatively, the HF semiconductor circuit preferably has a configuration that includes the HF semiconductor device, and an oscillator circuit connected to the HF semiconductor device.

According to another aspect of the present invention, an HF semiconductor device includes a semiconductor substrate, an electroconductor layer provided on the semiconductor substrate, a first insulator layer for electrically insulating the electroconductor layer from the semiconductor substrate, a spiral wire provided on the semiconductor substrate to oppose the electroconductor layer, a second insulator layer for electrically insulate the spiral wire from the electroconductor layer and the semiconductor substrate, and an HF-signal isolating section provided between the electroconductor layer and a ground potential to isolate an HF component flowing between the electroconductor layer and the ground potential. The HF semiconductor device further includes cutouts provided in positions of the electroconductor layer that opposes the spiral wire, wherein the cutouts are provided to radially extend from a position opposing the spiral wire as a center.

In the above-described HF semiconductor device, the electroconductor layer functions as a shield with respect to the spiral wire. As such, the anti-leakage property is increased to prevent the signal (HF signal) from leaking from the spiral wire. The configuration therefore reduces the loss of the HF signal that occurs because of a resistant component of the semiconductor substrate.

The signal isolating section is preferably an insulator. Alternatively, the signal isolating section is preferably a resistor. Still alternatively, the signal isolating section is preferably an inductor. Still alternatively, it is preferable that the signal isolating section be formed to comprise an inductor and a capacitor that are in parallel connected; and a resonant frequency of the signal isolating section is in the same frequency band of the signal fed to the spiral wire. Still alternatively, the signal isolating section is preferably a distributed-constant line having a line-length equivalent to an odd multiple of one quarter of a wavelength of the signal fed to the spiral wire. In any one of these cases, the electroconductor layer functions as a shield. This configuration therefore reduces the leakage of differential signals, which flow to the spiral wire, to the semiconductor substrate. Consequently, the configuration reduces the loss of the differential signals that occurs because of a resistant component of the semiconductor substrate.

Still alternatively, the electroconductor layer is preferably formed of one of metal, p-type doped polysilicon, and n-type doped polysilicon. Still alternatively, the electroconductor layer is preferably an electroconductive silicon layer that is different from the semiconductor. In any one of these cases, the electroconductor layer functions as a shield. This configuration therefore reduces the leakage of differential signals, which flow to the wires, to the semiconductor substrate. Consequently, the configuration reduces the loss of the differential signals that occurs because of a resistant component of the semiconductor substrate.

According to still another aspect of the present invention, an HF semiconductor device includes a semiconductor substrate, a first insulator layer, an electroconductor layer provided on the first insulator layer, a second insulator layer provided on the electroconductor layer, a first wire provided on the second insulator layer to oppose the electroconductor layer, a dielectric layer provided on the first wire, a second wire provided on the dielectric layer to oppose the first wire, and an HF-signal isolating section provided between the electroconductor layer and a ground to isolate an HF component flowing between the electroconductor layer and the ground.

In the above-described HF semiconductor device, the electroconductor layer functions as a shield. As such, the leakage of differential signals, which flow to the first and second wires, to the semiconductor substrate is reduced. The configuration therefore reduces the loss of the differential signals that occurs because of a resistant component of the semiconductor substrate.

The signal isolating section is preferably an insulator. Alternatively, the signal isolating section is preferably a resistor. Still alternatively, the signal isolating section is preferably an inductor. Still alternatively, it is preferable that the HF-signal isolating section be formed to comprise an inductor and a capacitor that are in parallel connected; and a resonant frequency of the signal isolating section is in the same frequency band of the signal fed to each of the wires. Still alternatively, the signal isolating section is preferably a distributed-constant line having a line-length equivalent to an odd multiple of one quarter of a wavelength of the signal fed to one of the first and second wires. In any one of these cases, the electroconductor layer functions as a shield. This configuration therefore reduces the leakage of differential signals, which flow to the wires, to the semiconductor substrate. Consequently, the configuration reduces the loss of the differential signals that occurs because of a resistant component of the semiconductor substrate.

Still alternatively, the electroconductor layer is preferably formed of one of metal, p-type doped polysilicon, and n-type doped polysilicon. Still alternatively, the electroconductor layer is preferably an electroconductive silicon layer that is different from the semiconductor. In any one of these cases, the electroconductor layer functions as a shield. This configuration therefore reduces the leakage of differential signals, which flow to the wires, to the semiconductor substrate. Consequently, the configuration reduces the loss of the HF signals that occurs because of a resistant component of the semiconductor substrate.

BRIEF DESCRIPTION OF THE DRAWINGS

These and other objects as well as advantages of the invention will become clear by the following description of preferred embodiments of the invention with reference to the accompanying drawings, wherein:

FIG. 5 is a cross sectional view of a fifth example configuration of the HF semiconductor device according to the first embodiment of the present invention;

FIG. 10 is a circuit diagram of an HF semiconductor device according to a fifth preferable embodiment of the present invention;

FIG. 11 is a circuit diagram of an HF semiconductor device according to a sixth preferable embodiment of the present invention;

In all these figures, like components are indicated by the same numerals.

DESCRIPTION OF THE PREFERRED EMBODIMENTS (First Embodiment)

Figure 1A:
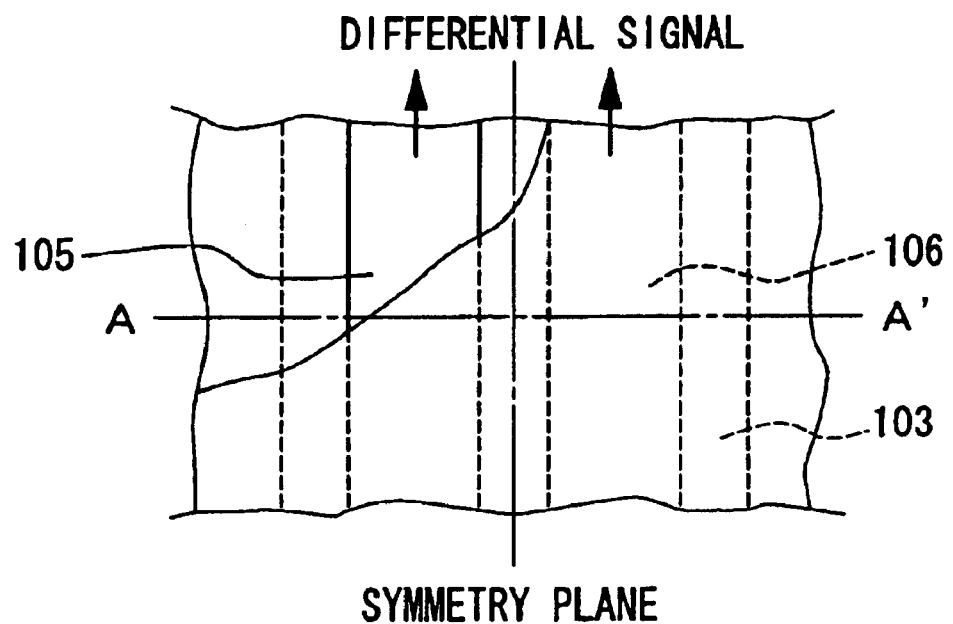
FIG. 1A is a plan view of a first example configuration of a high-frequency (HF) semiconductor device according to a first preferred embodiment of the present invention.
Figure 1B:
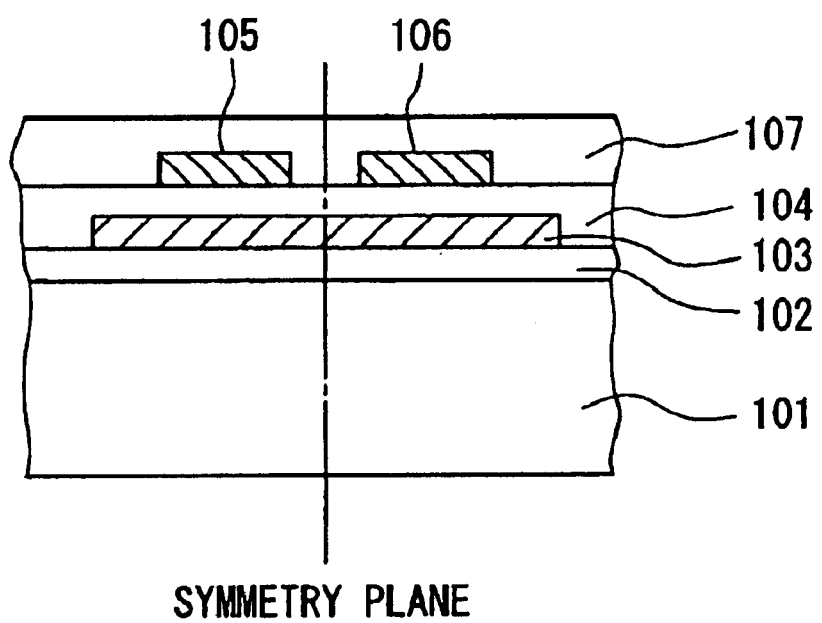
FIG. 1B is a cross sectional view along the line A–A' of FIG. 1A.

Hereinbelow, a first example configuration of an HF semiconductor device according to a first embodiment will be described with reference to FIGS. 1A and 1B. A lower insulator layer 102 is formed of, for example, a $SiO_2$ insulator film, to cover the surface of a doped electroconductive p-type silicon substrate 101. An n-type silicon layer 103 is formed to cover the surface of the lower insulator layer 102. The n-type silicon layer 103 is doped at a concentration higher than that of the p-type silicon substrate 101. An upper insulator layer 104 is formed of, for example, a $SiO_2$ insulator film, to cover the surface of the n-type silicon layer 103. On the surface of the upper insulator layer 104, first and second wires 105 and 106 each formed of one of Al and Cu are formed on the surface of the upper insulator layer 104. A protection layer 107 is formed on the surfaces of the first and second wires 105 and 106. The p-type silicon substrate 101 is connected to a ground node (not shown). The n-type silicon layer 103 and the first and second wires 105 and 106 are formed to be peripherally symmetric with respect to a symmetry plane shown in FIGS. 1A and 1B. FIGS. 1A and 1B each show the views with the positional relationship with respect to the aforementioned symmetry plane. The positional relationship with respect to the symmetry plane is applied to all the other similar drawings referenced below.

The lower insulator layer 102 electrically isolates the n-type silicon layer 103 (electroconductor layer) from the p-type silicon substrate 101. The lower insulator layer 102 forms a first insulator layer. The upper insulator layer 104 and the lower insulator layer 102 electrically insulate the first and second wires 105 and 106 from the n-type silicon layer 103 (electroconductor layer) and the p-type silicon substrate 101. Thus, the upper insulator layer 104 and the lower insulator layer 102 form a second insulator layer.

Hereinbelow, operation of the above-described HF semiconductor device will be described.

When differential signals having the same amplitude flow to the individual first and second wires 105 and 106, the symmetry plane shown in FIGS. 1A and 1B works as a virtual ground; that is, the symmetry plane becomes at a potential of 0. Accordingly, differential signals leaked from the two first and second wires 105 and 106 to the n-type silicon layer 103 via the parasitic capacitance of the upper insulator layer 104 flow to the n-type silicon layer 103. Consequently, dissimilar to the case of the prior art, the n-type silicon layer 103 need not be ground via the first and second wires 105 and 106.

However, when common signals having the same amplitude flow to the individual first and second wires 105 and 106, the symmetry plane does not become at a potential of 0. Accordingly, the common signals leaked from the two first and second wires 105 and 106 to the n-type silicon layer 103 via the parasitic capacitance of the upper insulator layer 104 flow to the p-type silicon substrate 101 via the parasitic capacitance of the lower insulator layer 102, and are attenuated by the resistance component of the p-type silicon substrate 101. The differential signal and the common signal are referred to as differential signals.

Figure 2A:
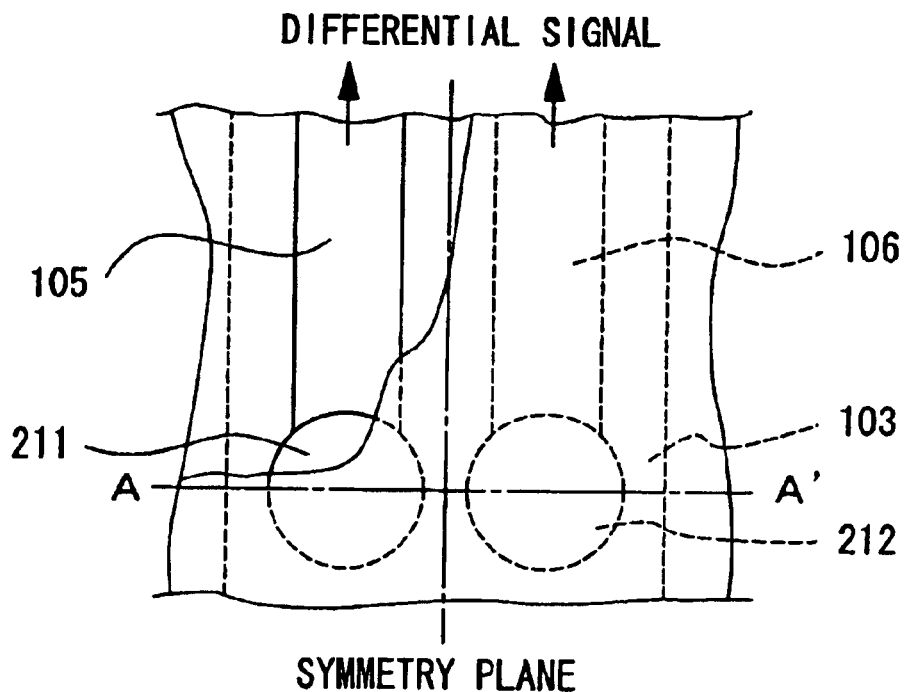
FIG. 2A is a plan view of a second example configuration of the HF semiconductor device according to the first embodiment of the present invention.
Figure 2B:
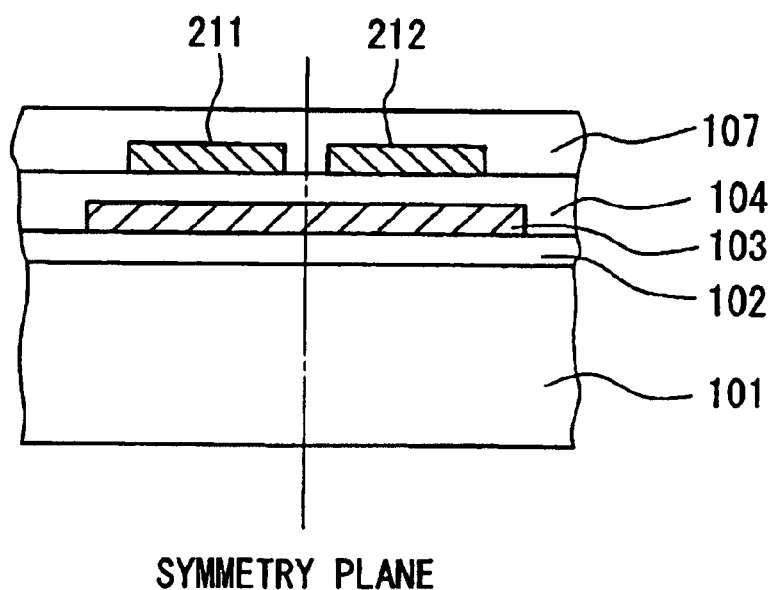
FIG. 2B is a cross sectional view along the line A–A' of FIG. 2A.

Hereinbelow, a second example configuration of the HF semiconductor device according to the first embodiment will be described with reference to FIGS. 2A and 2B. Two bonding pads 211 and 212 are formed between the upper insulator layer 104 and the protection layer 107, and are connected to second wires 105 and 106, respectively. Also the bonding pads 211 and 212 are formed to be peripherally symmetric with respect to a symmetry plane shown in FIGS. 2A and 2B. While the bonding pads 211 and 212 are formed for use purposes different from those of the first and second wires 105 and 106, since the electrical operations thereof are the same as thereof, they can be construed as wires.

As in the first example configuration, also in the HF semiconductor device of the second example configuration, differential signals leaked from the first and second wires 105 and 106 and the bonding pads 211 and 212 flows to a virtual ground. On the other hand, common signals are attenuated by a resistance component of the p-type silicon substrate 101.

Compared to the prior-art HF semiconductor device, in the HF semiconductor device of the first embodiment, the influence of parasitic inductance is significantly small. As such, differential signals flowing to the first and second wires 105 and 106 can be shielded from the p-type silicon substrate 101.

Compared to the prior-art HF semiconductor device, in the HF semiconductor device of the first embodiment, a resistant component of the p-type silicon substrate 101 attenuates disturbance signals that have been input as common signals to the ungrounded first and second wires 105 and 106.

In the configuration of the prior-art HF semiconductor device, the n-type silicon layer formed of the electroconductor layer is grounded. As such, in proportion to the increase in the integration density of the HF semiconductor device, longer wires are used to couple the n-type silicon layer to the ground. This arises a problem in that a significantly large area needs to be used for the wires in the HF semiconductor device.

In the HF semiconductor device of the first embodiment, it is sufficient to simply isolate the n-type silicon layer 103 from the ground by using the lower insulator layer 102 and the upper insulator layer 104. As such, the wires for coupling the n-type silicon layer 103 to the ground can be reduced shorter than that in the prior-art HF semiconductor device. Consequently, the HF semiconductor device of the first embodiment can be miniaturized by the reduced lengths of the wires.

The feeding of differential signals is a method that has conventionally been employed for HF semiconductor devices. In addition, a case can be in which the n-type silicon layer is used to facilitate flattening of a substrate in a semiconductor device having a floating structure enclosed by an insulator layer formed therebelow.

However, the wire for transmitting HF signals of several hundred megahertz or higher, which can cause a problematic loss in the silicon substrate, is formed to have a relatively larger linewidth (for example, in a range of from 5 to 20 $\mu$m) in order to prevent the parasitic resistance from increasing because of surface skin effects.

In contrast, the n-type silicon layer, which is provided to flatten the substrate, is formed to have a relatively small linewidth of 1 $\mu$m or smaller in order to prevent resonance with an HF signal. As such, in the configuration, the n-type silicon layer 103 is not formed to cover the overall lower layer of the first and second wires 105 and 106. Consequently, the configuration of the HF semiconductor device of the first embodiment (particularly, the configuration of the n-type silicon layer 103) is completely different from the configuration in the n-type silicon layer is provided for the flattening purpose.

As described above, according to the first embodiment, the highly doped n-type silicon layer 103 is formed between the first and second wires 105 and 106 and the p-type silicon substrate 101. This enables the prevention of the loss of differential signals flowing to the first and second wires 105 and 106 from being caused by the resistance component of the p-type silicon substrate 101.

Figure 3:
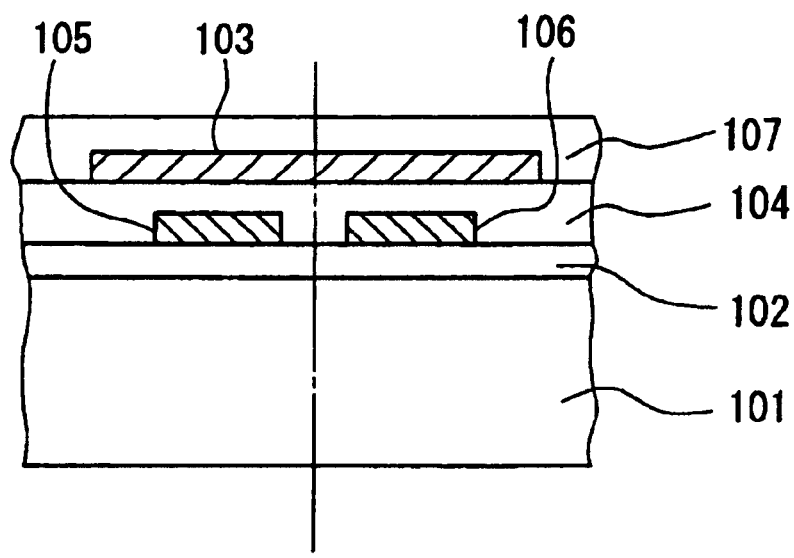
FIG. 3 is a cross sectional view of a third example configuration of the HF semiconductor device according to the first embodiment of the present invention.

FIG. 3 shows a third example configuration of the first embodiment. As shown in the figure, the forming positions of the n-type silicon layer 103 and the first and second wires 105 and 106 may be vertically reversed. In this case, advantages similar to those in the above-described example configuration can be obtained by forming the n-type silicon layer 103 in the vicinity of the first and second wires 105 and 106. A reason for the above is that electrofields of HF signals flowing to the first and second wires 105 and 106 concentrate in the n-type silicon layer 103, thereby reducing the leakage to the p-type silicon substrate 101.

In the present example configuration, the lower insulator layer 102 and the upper insulator layer 104 electrically insulate the n-type silicon layer 103 (electroconductor layer) from the p-type silicon substrate 101. Thus, the lower insulator layer 102 and the upper insulator layer 104 form a first insulator layer. Concurrently, the lower insulator layer 102 and the upper insulator layer 104 electrically insulate the first and second wires 105 and 106 from the n-type silicon layer 103 (electroconductor layer) and the p-type silicon substrate 101. The upper insulator layer 104 and the lower insulator layer 102 form a second insulator layer.

While the first embodiment uses two phases of wires, it may be configured using three or four phases of wires. In a configuration using three phases of wires, signals that are each out of phase in units of 120 degree are fed to flow therethrough. In a configuration using four phases of wires, signals that are each out of phase in units of 90 degree are fed to flow therethrough. Thereby, advantages similar to those described above can be obtained.

In addition, while the first embodiment uses two phases of wires, it may be configured to allow the common signal and the differential signal to be alternately fed to flow therethrough.

In the first embodiment, N wires to which N-phase signals are fed are provided (N=a positive integer not smaller than 2). $N_1$ wires ($N_1$=0 or a positive integer equaling or less than N) are provided on the one surface side of the n-type silicon layer (electroconductor layer); $N_2$ wires ($N_2$=0 or positive integer satisfying $N_1+N_2$=N) are provided on the other surface side of the n-type silicon layer (electroconductor layer). The above-described wire arrangement and signal-feeding method are employed also in other embodiments described below).

Figure 4:
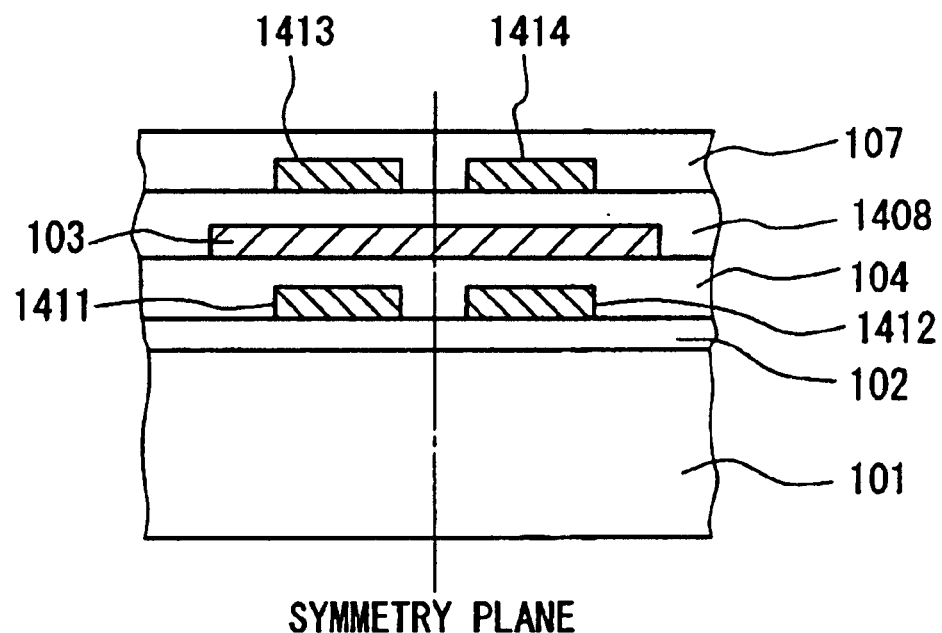
FIG. 4 is a cross sectional view of a fourth example configuration of the HF semiconductor device according to the first embodiment of the present invention.

Either of a configuration using the four phases of wires or a configuration using two sets of the two phases of wires may be arranged as a configuration shown in a fourth example configuration of the first embodiment shown in FIG. 4. As shown in FIG. 4, the surface of the p-type silicon substrate 101 is covered by the lower insulator layer 102. First second wires 1411 and 1412 are formed on the surface of the lower insulator layer 102. The surfaces of the first second wires 1411 and 1412 are covered by the upper insulator layer 104. The n-type silicon layer 103 (electroconductor layer) is formed on the upper insulator layer 104. The surface of the n-type silicon layer 103 is covered by an obverse-surface-side insulator layer 1408 formed of, for example, an $SiO_2$ insulator film. Third and fourth wires 1413 and 1414 are formed on an upper surface of the obverse-surface-side insulator layer 1408. The protection layer 107 is formed on upper surfaces of the third and fourth wires 1413 and 1414. The p-type silicon substrate 101 is connected to a ground (not shown). The n-type silicon layer 103, the first second wires 1411 and 1412, and the third and fourth wires 1413 and 1414 are formed to be peripherally symmetric with respect to a symmetry plane shown in FIG. 4. Advantages similar to those in the above-described example configuration can be obtained by forming the n-type silicon layer 103 in the vicinities of the first and second wires 1411 and 1412 and the third and fourth wires 1413 and 1414.

In the present example configuration, the lower insulator layer 102 and the upper insulator layer 104 electrically insulate the n-type silicon layer 103 (electroconductor layer) from the p-type silicon substrate 101. Thus, the lower insulator layer 102 and the upper insulator layer 104 form a first insulator layer. The lower insulator layer 102, the upper insulator layer 104, and the obverse-surface-side insulator layer 1408 electrically insulate the first to fourth wires 1411 to 1414 from the n-type silicon layer 103 (electroconductor layer) and the p-type silicon substrate 101. Thus, the upper insulator layer 104, the lower insulator layer 102, and the obverse-surface-side insulator layer 1408 form a second insulator layer.

A fifth example configuration is shown in FIG. 5. As shown therein, the surface of the p-type silicon substrate 101 is covered by the lower insulator layer 102. A first n-type silicon layer 1811 (first electroconductor layer) is formed on the surface of the lower insulator layer 102. The upper insulator layer 104 covers the surface of the surface of the first n-type silicon layer 1811 (first electroconductor layer). The first and second wires 105 and 106 are formed on the surface of the upper insulator layer 104. The surfaces of the first and second wires 105 and 106 are covered by an obverse-surface-side insulator layer 1808 formed of, for example, an SiO$_2$ insulator film. A second n-type silicon layer 1812 (second electroconductor layer) is formed on the surface of the obverse-surface-side insulator layer 1808. The protection layer 107 is formed on the surface of the second n-type silicon layer 1812. The p-type silicon substrate 101 is connected to a ground (not shown). The first n-type silicon layer 1811, the second n-type silicon layer 1812, and the first and second wires 105 and 106 are formed to be peripherally symmetric with respect to a symmetry plane shown in FIG. 5. In this case, advantages similar to those in the above-described example configuration can be obtained by forming the first and second n-type silicon layer 1811 and 1812 in the vicinities of the first and second wires 105 and 106.

In the present example configuration, the lower insulator layer 102, the upper insulator layer 104, and the obverse-surface-side insulator layer 1808 electrically insulate the first and second n-type silicon layer 1811 and 1812 from the p-type silicon substrate 101. Thus, the lower insulator layer 102, the upper insulator layer 104, and the obverse-surface-side insulator layer 1808 form a first insulator layer. Concurrently, the lower insulator layer 102, the upper insulator layer 104, and the obverse-surface-side insulator layer 1808 electrically insulate the first and second wires 105 and 106 from the first and second n-type silicon layer 1811 and 1812 (electroconductor layers) and the p-type silicon substrate 101. Thus, the upper insulator layer 104, the lower insulator layer 102, and the obverse-surface-side insulator layer 1408 form a second insulator layer.

As described above, differential signals, common signals, or signals with equally different phases are fed to flow through the plurality of wires in the first embodiment. However, similar advantages can even be obtained with out-of-phase signals being fed to flow through the wires. In the first embodiment, the out-of-phase signal is considered to be a composite signal of a high common signal and a low differential signal. As such, on one hand, an common component is attenuated by a resistance component of the p-type silicon substrate 101. On the other hand, the loss of an differential component is reduced by a resistance component of the p-type silicon substrate 101.

The n-type silicon layer 103 may be replaced by a wire formed of, for example, highly doped p-type silicon or one of Al or Cu metal films.

The embodiment may be implemented even in a configuration not including the lower insulator layer 102. In the configuration, a depletion layer occurring with a p-n junction of the n-type silicon layer 103 and the p-type silicon substrate 101 functions similar to the lower insulator layer 102.

Figure 6A:
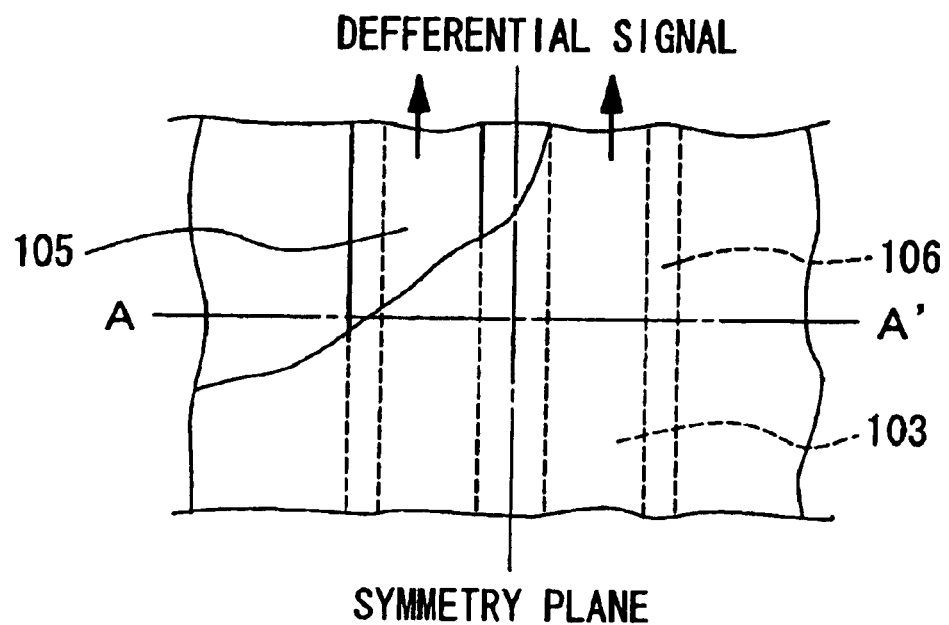
FIG. 6A is a plan view of a fifth example configuration of the HF semiconductor device according to the first embodiment of the present invention.
Figure 6B:
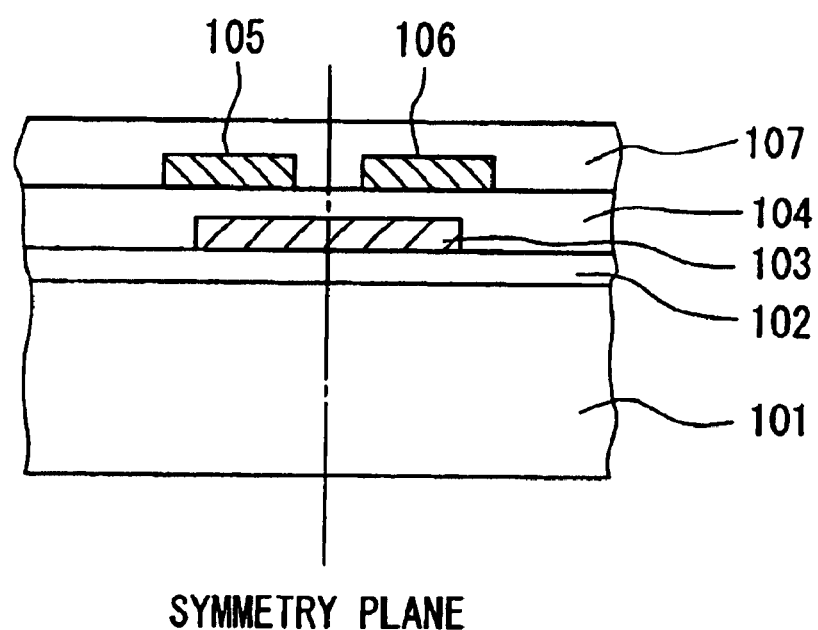
FIG. 6B is a cross sectional view along the line A–A' of FIG. 6A.

FIGS. 6A and 6B show a sixth example configuration of the present invention. As shown in the figures, the n-type silicon layer 103 need not be formed to cover the overall lower layer of the first and second wires 105 and 106.

According to the first embodiment, the chip area used for the HF semiconductor device can be reduced.

(Second Embodiment)

Figure 7A:
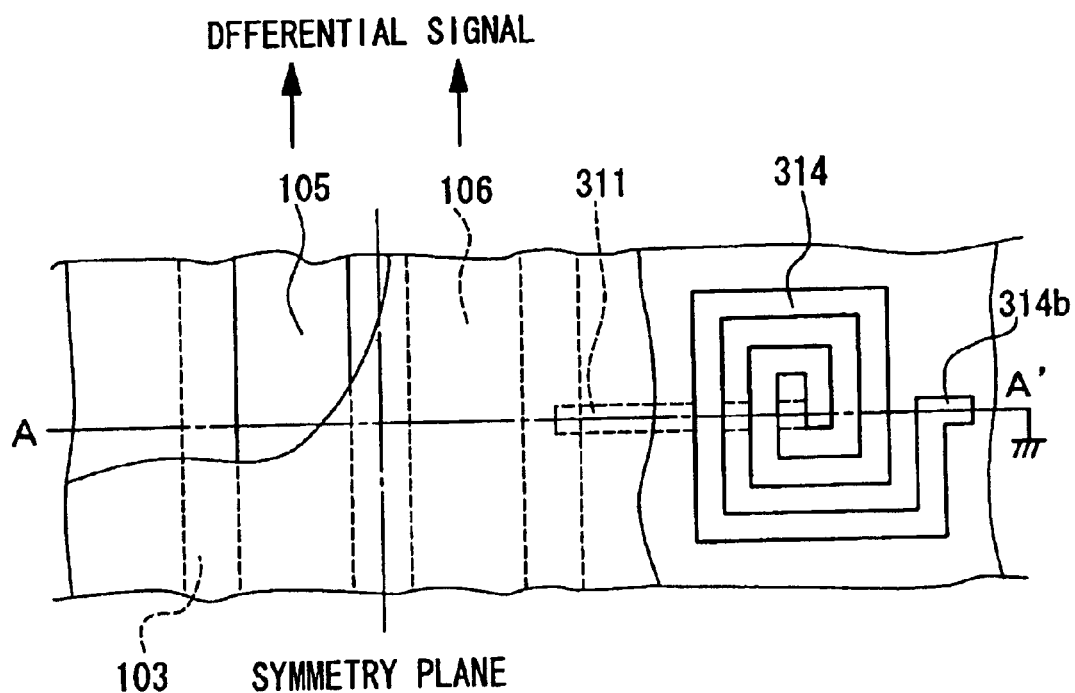
FIG. 7A is a plan view of an HF semiconductor device according to a second preferable embodiment of the present invention.
Figure 7B:
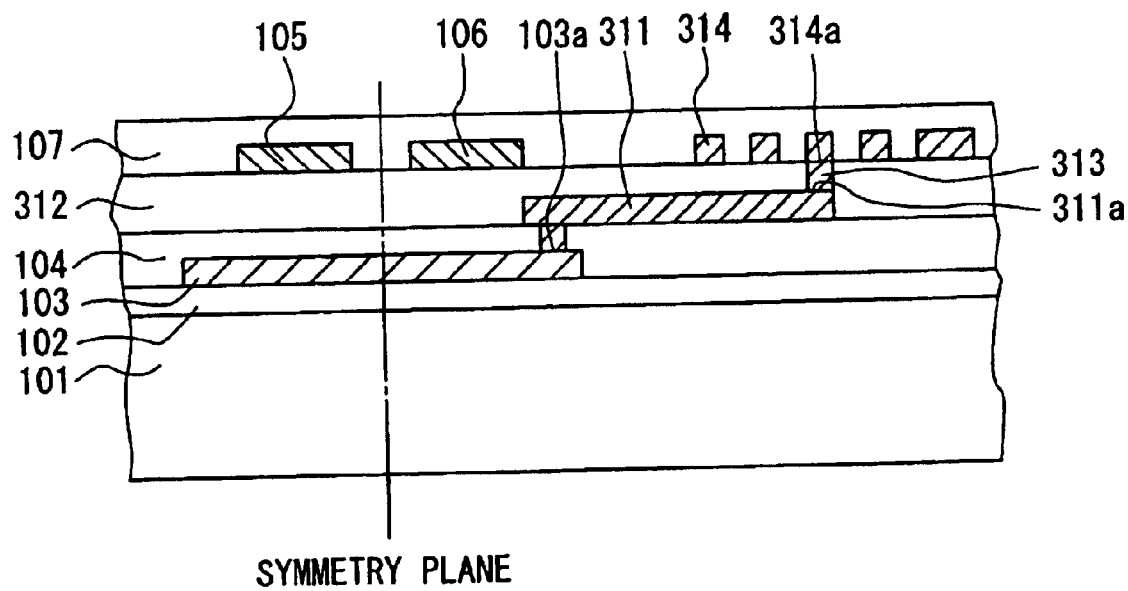
FIG. 7B is a cross sectional view along the line A–A' of FIG. 7A.

Hereinbelow, an example configuration of an HF semiconductor device according to a second embodiment will be described with reference to FIGS. 7A and 7B. A lower insulator layer 102 covers the surface of a p-type silicon substrate 101 (semiconductor substrate). An n-type silicon layer 103 is formed on the surface of the lower insulator layer 102. An upper insulator layer 104 covers the surface of the n-type silicon layer 103 with a terminal portion 103a remaining not covered. A leader wire 311 formed of, for example, an Al or Cu metal film, is formed on the surface of the upper insulator layer 104. A third insulator layer 312 formed of, for example, an SiO$_2$ insulator film, covers the surface of the leader wire 311 with a terminal portion 311a remaining not covered. A plug 313 formed of a material such as tungsten is buried in a portion on the terminal portion 311a. Thereafter, a first and second wires 105 and 106 and spiral wire 314 is formed on the surface of the third insulator layer 312. The spiral wire 314 is formed of, for example, an Al or Cu metal film, and forms an inductor. A protection layer 107 is formed on the surface of the spiral wire 314. The p-type silicon substrate 101 is connected to a ground (not shown). The n-type silicon layer 103 and the first and second wires 105 and 106 are formed to be peripherally symmetric with respect to a symmetry plane in FIGS. 7A and 7B.

The leader wire 311 is connected to the n-type silicon layer 103 via the terminal portion 103a. An inner terminal 314a is provided at an inner peripheral end of the spiral wire 314. The inner terminal 314a is connected to the terminal portion 311a of the leader wire 311 via the plug 313. An outer terminal 314b is provided in an outer peripheral portion of the spiral wire 314. The outer terminal 314b is connected to a ground.

The lower insulator layer 102 electrically isolates the n-type silicon layer 103 (electroconductor layer) from the p-type silicon substrate 101. The lower insulator layer 102 forms a first insulator layer. The upper insulator layer 104, the lower insulator layer 102, and the third insulator layer 312 electrically insulate the first and second wires 105 and 106 from the n-type silicon layer 103 (electroconductor layer) and the p-type silicon substrate 101. Thus, the upper insulator layer 104 and the lower insulator layer 102 form a second insulator layer.

In the HF semiconductor device of the second embodiment, as in the configuration shown in FIGS. 1A and 1B, differential signals leaked from the ungrounded first and second wires 105 and 106 to the n-type silicon layer 103 flows to a virtual ground. On the other hand, common signals leaked from the first and second wires 105 and 106 flows to the p-type silicon substrate 101, and is attenuated by a resistance component of the p-type silicon substrate 101. This occurs because the spiral wire 314 isolates the n-type silicon layer 103 from the ground.

In addition to the advantages, the HF semiconductor device of the second embodiment offers advantages in that electrical charge does not accumulate in the n-type silicon layer 103, and the direct-current potential in the n-type silicon layer 103 is fixed to a potential of the ground.

In the second embodiment, since the n-type silicon layer 103 connected to the ground via the induction-forming spiral wire 314, the direct-current potential in the n-type silicon layer 103 is fixed to the potential of the ground.

The forming positions of the n-type silicon layer 103 and the first and second wires 105 and 106 may be vertically reversed. In this case, advantages similar to those in the above-described example configuration can be obtained by forming the n-type silicon layer 103 in the vicinity (not shown) of the first and second wires 105 and 106. A reason for the above is that electrofields of HF signals flowing to the first and second wires 105 and 106 concentrate in the n-type silicon layer 103, thereby reducing the leakage to the p-type silicon substrate 101.

While the second embodiment uses the two phases of wires, it may be configured using three or four phases of wires. In a configuration using three phases of wires, signals that are each out of phase in units of 120 degree are fed to flow therethrough. In a configuration using four phases of wires, signals that are each out of phase in units of 90 degree are fed to flow therethrough. Thereby, advantages similar to those described above can be obtained.

While the second embodiment uses the two wires, it may be arranged such that an common signal and an differential signal are alternately fed to three or more wires. Either of a configuration using the four phases of wires or a configuration using two sets of the two phases of wires may be arranged as a configuration shown in FIG. 7. One end of the spiral wire 314, which is formed of the metal layer such as an Al or Cu metal film is connected to the n-type silicon layer 103. In this arrangement, the other end of the spiral wire 314 may be connected to a ground (not shown). Advantages similar to those described above can be obtained by disposing the n-type silicon layer 103 in the vicinity of the first and second wires 105 and 106.

The second embodiment may employ the configuration shown in FIG. 5. More specifically, the configuration may be such that one end of the spiral wire 314 formed of a metal film such as an Al or Cu film is connected to the first and second n-type silicon layer 1811 and 1812, and the other end of the spiral wire 314 is connected to the ground (not shown). Also in this case, advantages similar to those described above can be obtained by disposing the first and second n-type silicon layer 1811 and 1812 in the vicinity of the first and second wires 105 and 106.

In the second embodiment, differential signals, common signals, or signals with equally different phases are fed to flow through the plurality of wires. However, in the second embodiment, similar advantages can even be obtained with out-of-phase signals being fed to flow through the wires. In the present invention, the out-of-phase signal is considered to be a composite signal of a high common signal and a low differential signal. As such, on one hand, an common component is attenuated by a resistance component of the p-type silicon substrate 101. On the other hand, the loss of an differential component is reduced by a resistance component of the p-type silicon substrate 101.

The n-type silicon layer 103 may be replaced by a wire formed of, for example, highly doped p-type silicon or an Al or Cu metal film.

The present embodiment may be implemented even in a configuration not including the lower insulator layer 102. In the configuration, a depletion layer occurring with a p-n junction of the n-type silicon layer 103 and the p-type silicon substrate 101 functions similar to the lower insulator layer 102.

A MIM capacitor or a MOS capacitor may be in parallel connected to the induction-forming spiral wire 314. In this case, the resonant frequencies of the inductor and capacitor are preferably in the same frequency bands of signals flowing through the first and second wires 105 and 106.

The configuration may use a resistor formed of, for example, doped polysilicon, to replace the induction-forming spiral wire 314. With this configuration being employed, the common signals are also attenuated by the resistor.

The induction-forming spiral wire 314 may be replaced by a distributed-constant line that is formed of, for example, a metal wire and that has a line-length equivalent to an odd multiple of one quarter of a wavelength of the signal. Alternatively, the induction-forming spiral wire 314 may be replaced by an inductor formed of a rewiring layer of a chip size package (CSP). Still alternatively, the induction-forming spiral wire 314 may be replaced by an inductor built in a laminated substrate.

(Third Embodiment)

Figure 8A:
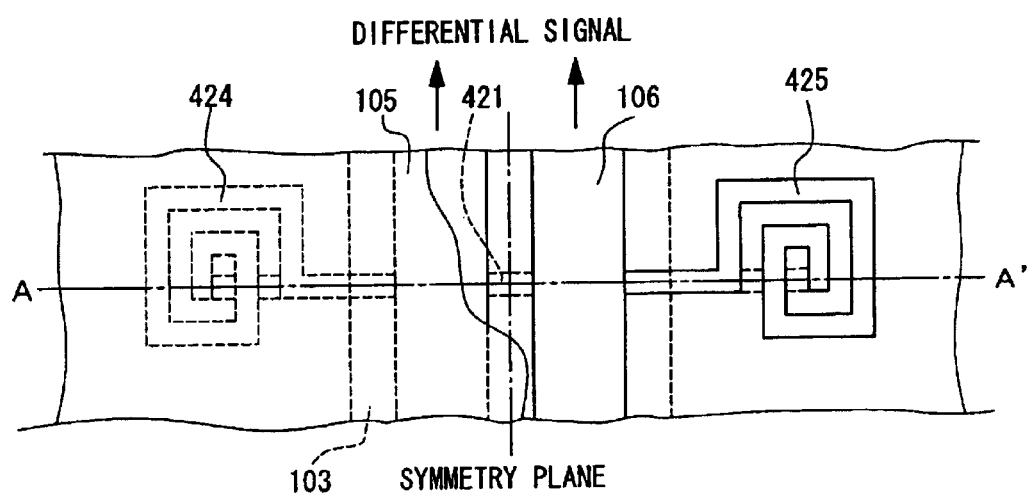
FIG. 8A is a plan view of an HF semiconductor device according to a third preferable embodiment of the present invention.
Figure 8B:
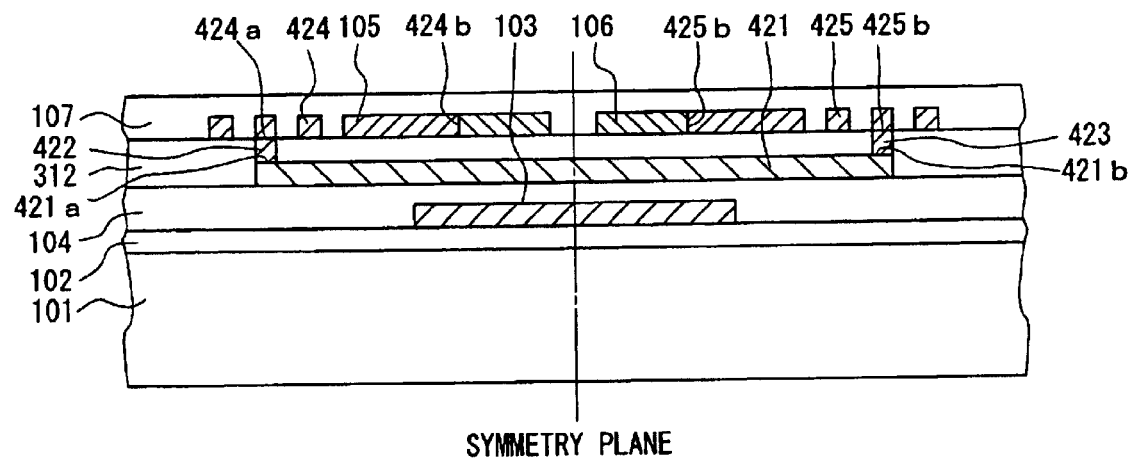
FIG. 8B is a cross sectional view along the line A–A' of FIG. 8A.

Hereinbelow, an example configuration of an HF semiconductor device according to a third embodiment will be described with reference to FIGS. 8A and 8B. A lower insulator layer 102 covers the surface of a p-type silicon substrate 101 (semiconductor substrate). An n-type silicon layer 103 is formed on the surface of the lower insulator layer 102. An upper insulator layer 104 covers the surface of the n-type silicon layer 103. A leader wire 421 formed of, for example, an Al or Cu metal film, is formed on the surface of the upper insulator layer 104. An obverse-surface-side insulator layer 312 covers the surface of the leader wire 421 with terminal portions 421*a* and 421*b* remaining not covered. Plugs 422 and 423 formed of a material such as tungsten are buried in portions on the terminal portions 421*a* and 421*b*, respectively. Thereafter, first and second wires 105 and 106 and spiral wires 424 and 425 are formed on the surface of the obverse-surface-side insulator layer 312. The spiral wires 424 and 425 are formed of, for example, an Al or Cu metal film, and individually form inductors. A protection layer 107 is formed on the surfaces of the spiral wires 424 and 425. The p-type silicon substrate 101 is connected to a ground (not shown). The n-type silicon layer 103 and the first and second wires 105 and 106 are formed to be peripherally symmetric with respect to a symmetry plane in FIGS. 8A and 8B.

Inner terminals 424*a* and 425*b* are provided at inner peripheral ends of the respective spiral wires 424 and 425. The inner terminals 424*a* and 425*b* are connected to the terminal portions 421*a* and 421*b* of the leader wire 421 via the respective plugs 422 and 423.

Outer terminals 424*b* and 425*b* are provided in outer peripheral portions of the respective spiral wires 424 and 425. The outer terminals 424*b* and 425*b* are connected to the first and second wires 105 and 106, respectively.

The lower insulator layer 102 electrically isolates the n-type silicon layer 103 (electroconductor layer) from the p-type silicon substrate 101. The lower insulator layer 102 forms a first insulator layer. The lower insulator layer 102 and the upper insulator layer 104 electrically insulate the first and second wires 105 and 106 from the n-type silicon layer 103 (electroconductor layer) and the p-type silicon substrate 101. Thus, the upper insulator layer 104 and the lower insulator layer 102 form a second insulator layer.

In the HF semiconductor device of the third embodiment, as in the configuration shown in FIGS. 1A and 1B, differential signals leaked from the ungrounded first and second wires 105 and 106 to the n-type silicon layer 103 flows to a virtual ground. On the other hand, common signals are attenuated by a resistance component of the p-type silicon substrate 101.

In addition to the advantages, the HF semiconductor device of the third embodiment offers an advantage of offsetting a parasitic capacitance component occurring in the obverse-surface-side insulator layer 312 by an induction component of the spiral wires 424 and 425. This enables improvement regarding phase lags of the differential signals flowing through the first and second wires 105 and 106.

Thus, the third embodiment enables the improvement regarding phase lags of the differential signals flowing through the first and second wires 105 and 106. The improvement can be achieved in the way of making the configuration such that the first and second wires 105 and 106 are connected through the induction-forming spiral wires 424 and 425.

The forming positions of the n-type silicon layer 103 and the first and second wires 105 and 106 may be vertically reversed. In this case, advantages similar to those in the above-described example configuration can be obtained by forming the n-type silicon layer 103 in the vicinity (not shown) of the first and second wires 105 and 106. A reason for the above is that electrofields of HF signals flowing to the first and second wires 105 and 106 concentrate in the n-type silicon layer 103, thereby reducing the leakage to the p-type silicon substrate 101.

While the third embodiment uses the two phases of wires, it may be configured using three or four phase wires. In a configuration using three phase wires, signals that are each out of phase in units of 120 degree are fed to flow therethrough. In a configuration using four phase wires, signals that are each out of phase in units of 90 degree are fed to flow therethrough. Thereby, advantages similar to those described above can be obtained. While the present embodiment uses the two wires, it may be arranged such that an common signal and an differential signal are alternately fed to three or more wires.

Either of a configuration using the four phase wires or a configuration using two sets of the two phase wires may be arranged as a configuration shown in FIG. 4. In this case, spiral wires are provided corresponding to the individual first wire 1411, second wire 1412, third wire 1413, and fourth wire 1414. One-side ends of the spiral wires are connected to the first to fourth wires 1412 to 1414. In this arrangement, the other-side ends of the individual spiral wires may be connected to one another (not shown). Advantages similar to those described above can be obtained by disposing the n-type silicon layer 103 in the vicinities of the first to fourth wires 1411 to 1414.

The third embodiment may employ the configuration shown in FIG. 5. More specifically, the configuration may be such that one-side ends of the individual spiral wires 424 and 425 are connected to the first and second n-type silicon layers 1811 and 1812, and the other-side ends of the spiral wires 424 and 425 are connected to a ground (not shown).

Also in this case, advantages similar to those described above can be obtained by disposing the first and second n-type silicon layer 1811 and 1812 in the vicinities of the first and second wires 105 and 106.

In the third embodiment, differential signals, common signals, or signals with equally different phases are fed to flow through the plurality of wires. However, in the third embodiment, similar advantages can even be obtained with out-of-phase signals being fed to flow through the wires. In the present invention, the out-of-phase signal is considered to be a composite signal of a high common signal and a low differential signal. As such, on one hand, an common component is attenuated by a resistance component of the p-type silicon substrate 101. On the other hand, the loss of an differential component is reduced by a resistance component of the p-type silicon substrate 101.

The n-type silicon layer 103 may be replaced by a wire formed of, for example, highly doped p-type silicon or an Al or Cu metal film. The present embodiment may be implemented even in a configuration not including the lower insulator layer 102. In the configuration, a depletion layer occurring with a p-n junction of the n-type silicon layer 103 and the p-type silicon substrate 101 functions similar to the lower insulator layer 102.

(Fourth Embodiment)

Figure 9:
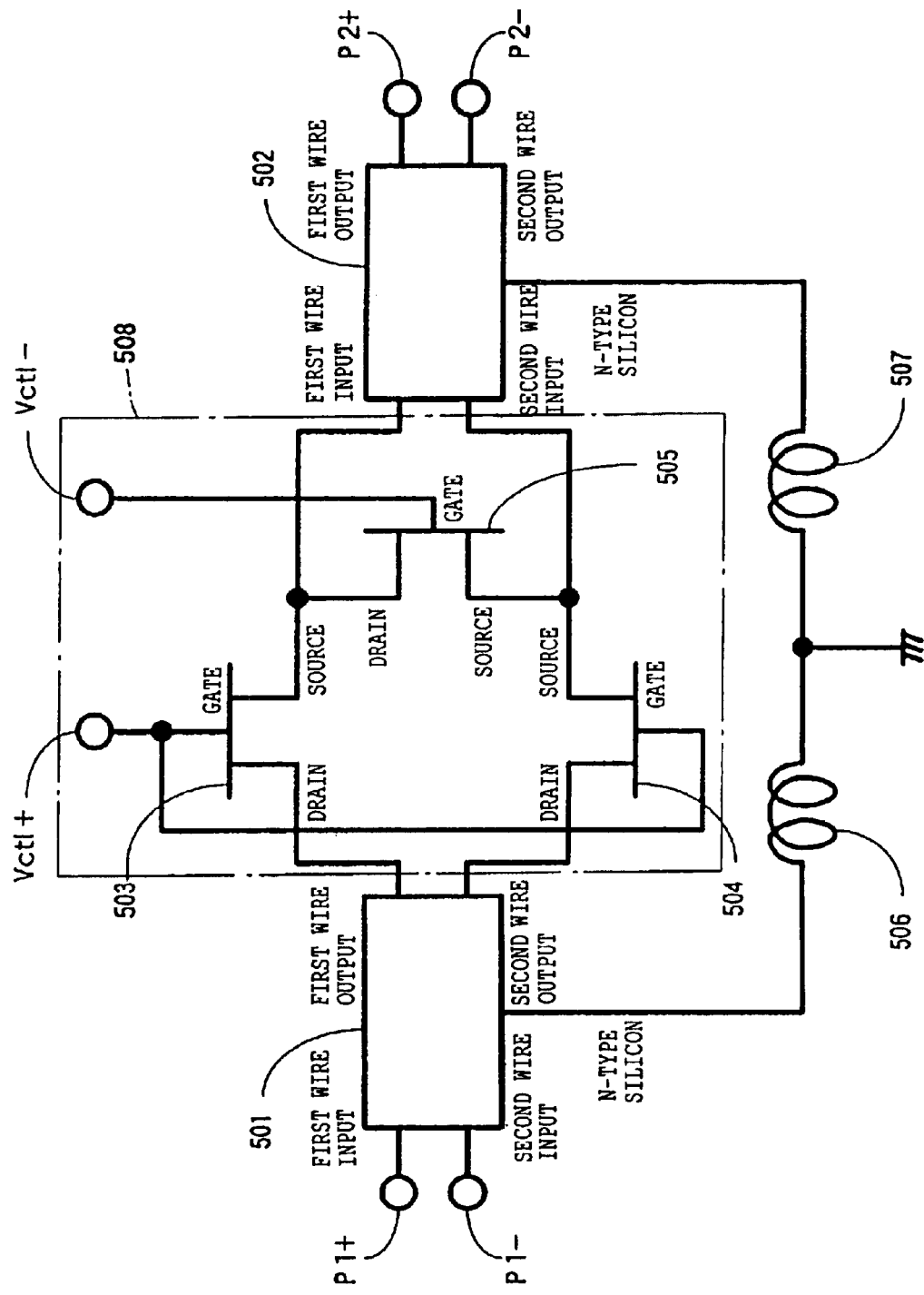
FIG. 9 is a circuit diagram of an HF semiconductor device according to a fourth preferable embodiment of the present invention.

Hereinbelow, an example configuration of an HF semiconductor circuit according to a fourth embodiment will be described with reference to FIG. 9. Numerals 501 and 502 each denote one of the HF semiconductor devices according to the first through the third embodiments. Numerals 503, 504, and 505 each denote an FET. Numerals 506 and 507 each denote an inductor formed of, for example, a spiral wire formed of a metal film such as an Al or Cu film. The FETs 503 to 505 form an example of a switch circuit section 508 that controls electrical isolation between the HF semiconductor devices 501 and 502. Input nodes P1+ and P1− are connected to first and second wire inputs of the HF semiconductor device 501, respectively. First and second wire outputs of the HF semiconductor device 501 are connected to the drains of the respective FETs 503 and 504. The sources of the FETs 503 and 504 are connected to the first and second wire inputs of the HF semiconductor device 502, respectively. The first and second wire outputs of the HF semiconductor device 502 are connected to output nodes P2+ and P2−, respectively. The source of the FET 503 is connected to the source of the FET 505. A control voltage Vct1+ is fed to the gates of the FETs 503 and 504. A control voltage Vct1− is fed to the gate of the FET 505. An n-type silicon layer (not shown) of the HF semiconductor device 502 is grounded via an inductor 507.

Hereinbelow, operation of the HF semiconductor circuit according to the fourth embodiment will be described.

On one hand, according to appropriate setting of the control voltages Vct1+ and Vct1−, the FETs 503 and 504 are turned on, and the FET 505 is turned off. In this case, differential signals input to the input nodes P1+ and P1− are not substantially attenuated and are output from the output nodes P2+ and P2−. On the other hand, according to appropriate setting of the control voltages Vct1+ and Vct1−, the FETs 503 and 504 are turned off, and the FET 505 is turned on. In this case, differential signals input to the input nodes P1+ and P1− are significantly attenuated and are output from the output nodes P2+ and P2−. Thus, the HF semiconductor circuit of the fourth embodiment operates as a differential switch circuit.

In the HF semiconductor circuit of the fourth embodiment, when the FETs 503 and 504 are turned on, and the FET 505 is turned off, the differential signals input to the input nodes P1+ and P1− leak less to the silicon substrate, in comparison to the HF semiconductor device. In addition, insertion loss occurring when the differential switch circuit is turned on is reduced.

In the HF semiconductor circuit of the fourth embodiment, electrical charge does not accumulate in the n-type silicon layers of the HF semiconductor devices 501 and 502, and the direct-current potentials in the n-type silicon layers are individually fixed to ground potentials.

In the HF semiconductor circuit of the fourth embodiment, the isolation when the differential switch circuit is turned off is improved for the following reason. In the HF semiconductor circuit of the fourth embodiment, when the FETs 503 and 504 are turned off, and the FET 505 is turned on, differential signals and common signals that have been input to the input nodes P1+ and P1− can leak to the output nodes P2+ and P2− via, for example, the n-type silicon layer of the HF semiconductor device 501 and the n-type silicon layer of the HF semiconductor device 502. However, the leakage of the signals is reduced by the inductors 506 and 507 and the ground.

The fourth embodiment uses one of the HF semiconductor devices of the first through the third embodiments for each of input and output sections of the differential switch circuit. As such, the n-type silicon layers of the HF semiconductor devices are connected to the input and output of the differential switch circuit via the inductors. This reduces the insertion loss occurring when the differential switch circuit is turned on.

The configuration may be modified such that the inductors 506 and 507 are removed, and the n-type silicon layers of the HF semiconductor devices 501 and 502 according to the first through the third embodiments are individually covered by an insulator made of, for example, a silicon oxide film.

A MIM capacitor and a MOS capacitor may be in parallel connected to the inductors 506 and 507. In this case, the resonant frequencies of the inductors and capacitors are preferably in the same frequency bands of signals flowing through the first and second wires. The configuration may use resistors formed of, for example, doped polysilicon, to replace the inductors 506 and 507. Alternatively, the inductors 506 and 507 may be each replaced by a distributed-constant line that is formed of, for example, a metal wire and that has a line-length equivalent to an odd multiple of one quarter of a wavelength of the signal. Still alternatively, the inductors 506 and 507 may be each replaced by an inductor formed of a rewiring layer of a chip size package (CSP). Yet alternatively, the inductors 506 and 507 may be each replaced by an inductor built in a laminated substrate.

(Fifth Embodiment)

Hereinbelow, an example configuration of an HF semiconductor circuit according to a fifth embodiment will be described with reference to FIG. 10. Numerals 601 and 602 each denote one of the HF semiconductor devices according to the first through the third embodiments. Numerals 603 and 604 each denote a bipolar transistor. Numerals 605 and 606 each denote a resistor. Numerals 606 to 611 each denote an inductor formed of, for example, a spiral wire formed of a metal film such as an Al or Cu film. The bipolar transistors 603 and 604, the resistors 605 and 606, and the inductors 607 to 611 amplifies a signal that has been out from the HF semiconductor device 601. The amplified signal is output to the HF semiconductor device 602. Thereby, the HF semiconductor circuit of the functions as an amplifying circuit section 612 that performs signal amplification.

Input nodes P1+ and P1− are connected to first and second wire inputs of the HF semiconductor device 601, respectively. First and second wire outputs of the HF semiconductor device 601 are input to the bases of the respective bipolar transistors 603 and 604. The collectors of the bipolar transistor 603 and 604 are connected to the first and second wire inputs of the HF semiconductor device 602, respectively. The first and second wire outputs of the HF semiconductor device 602 are connected to output nodes P2+ and P2−, respectively. The emitters of the bipolar transistors 603 and 604 are grounded via the inductor 609. A bias voltage Vbb is fed to the bases of the bipolar transistors 603 and 604 via the respective resistors 605 and 606. A power voltage Vcc is fed to the collectors of the bipolar transistors 603 and 604 via the respective resistors 607 and 608. An n-type silicon layer of the HF semiconductor device 601 is grounded via the inductor 610. An n-type silicon layer of the HF semiconductor device 602 is grounded via the inductor 611.

Hereinbelow, operation of the HF semiconductor circuit according to the fifth embodiment will be described.

On one hand, differential signals that have been input to the input nodes P1+ and P1− are amplified by the bipolar transistors 603 and 604. The amplified signals are then output to the output nodes P2+ and P2−. On the other hand, according to appropriate setting of the inductor 609 to an appropriate inductance value, common signals that have been input to the input nodes P1+ and P1− are attenuated by the bipolar transistors 603 and 604. The attenuated signals are then output to the output nodes P2+ and P2−. Thus, the HF semiconductor circuit of the fifth embodiment operates as a differential amplifier circuit.

In the HF semiconductor circuit of the fifth embodiment, compared to a conventional HF semiconductor circuit, the loss is reduced which is caused by the fact that differential signals input to the input nodes P1+ and P1− leak to the silicon substrates from wires of the bases of the bipolar transistors 603 and 604. Consequently, the noise immunity of the differential amplifier circuit can be improved.

Compared to a conventional HF semiconductor circuit, the loss is reduced which is caused by that the differential signals having been output from the collectors of the bipolar transistors 603 and 604 leak to the silicon substrates. Thereby, the output power loss in the differential amplifier circuit can be reduced.

In the HF semiconductor circuit of the fifth embodiment, electrical charge does not accumulate in the n-type silicon layers of the HF semiconductor devices 601 and 602, and the direct-current potentials in the n-type silicon layers are individually fixed to ground potentials.

In the HF semiconductor circuit of the fifth embodiment, the differential signals, which have been output from the collectors of the bipolar transistors 603 and 604, can leak to the bases of the bipolar transistors 603 and 604 via, for example, the n-type silicon layer of the HF semiconductor device 602 and the n-type silicon layer of the HF semiconductor device 601. However, the signal leakage is reduced by the inductors 610 and 611 and the ground. Consequently, the differential amplifier circuit is improved in stability.

According to the fifth embodiment, one of the HF semiconductor devices of the first through the third embodiments is used for each of input and output sections of a differential amplifier. As such, the n-type silicon layers of the HF semiconductor devices are connected to the input and output of the differential amplifier circuit via the inductors. This arrangement improves the noise immunity of the differential amplifier circuit. Thereby, the output power loss in the differential amplifier is reduced, and the stability thereof is improved.

The configuration may be modified such that the inductors 610 and 611 are removed, and the n-type silicon layers of the HF semiconductor devices 601 and 602 according to the first through the third embodiments are individually covered by an insulator made of, for example, a silicon oxide film.

A MIM capacitor and a MOS capacitor may be in parallel connected to the inductors 610 and 611. In this case, the resonant frequencies of the inductors and capacitors are preferably in the same frequency bands of signals flowing through the first and second wires.

In addition, the configuration may use resistors formed of, for example, doped polysilicon, to replace the inductors 610 and 611. Alternatively, the inductors 610 and 611 may be each replaced by a distributed-constant line that is formed of, for example, a metal wire and that has a line-length equivalent to an odd multiple of one quarter of a wavelength of the signal. Still alternatively, the inductors 610 and 611 may be each replaced by an inductor formed of a rewiring layer of a chip size package (CSP). Yet alternatively, the inductors 610 and 611 may be each replaced by an inductor built in a laminated substrate.

(Sixth Embodiment)

Hereinbelow, an example configuration of an HF semiconductor circuit according to a sixth embodiment will be described with reference to FIG. 11. Numerals 701 to 703 each denote one of the HF semiconductor devices according to the first through the third embodiments. Numerals 704 to 709 each denote a bipolar transistor. Numerals 710 to 713 each denote a resistor. Numerals 714 to 719 each denote an inductor formed of, for example, a spiral wire formed of a metal film such as an Al or Cu film. These circuit elements configure an example of a frequency converter circuit section 720.

Input nodes P1+ and P1− are connected to first and second wire inputs of the HF semiconductor device 701, respectively. First and second wire outputs of the HF semiconductor device 701 are connected to the bases of the respective bipolar transistors 704 and 705. The collector of the bipolar transistor 704 is connected to the emitters of the bipolar transistors 706 and 708. The collector of the bipolar transistor 705 is connected to the emitters of the bipolar transistors 707 and 709. The collectors of the bipolar transistors 706 and 707 are connected to first wire input of the HF semiconductor device 703. The collectors of the bipolar transistors 708 and 709 are connected to second wire input of the HF semiconductor device 703. The first and second outputs of the HF semiconductor device 703 are connected to output nodes P3+ and P3−, respectively. Input nodes P2+ and P2− are connected to first and second wire inputs of the HF semiconductor device 702, respectively. A first wire output of the HF semiconductor device 702 is input to the bases of the bipolar transistors 706 and 709. A second wire output of the HF semiconductor device 702 is input to the bases of the bipolar transistors 707 and 708. The emitters of the bipolar transistors 704 and 705 are grounded via the inductor 716. A bias voltage Vbb1 is fed to the bases of the bipolar transistors 704 and 705 via the respective resistors 710 and 711. A bias voltage Vbb2 is fed to the bases of the bipolar transistors 706 and 709 via the resistor 712. In addition, the bias voltage Vbb2 is fed to the bases of the bipolar transistors 707 and 708 via the resistor 713. A power voltage Vcc is fed to the collectors of the bipolar transistors 706 and 707 via the inductor 714. In addition, the power voltage Vcc is fed to the collectors of the bipolar transistors 708 and 709 via the inductor 715. An n-type silicon layer of the HF semiconductor device 701 is grounded via the inductor 717. An n-type silicon layer of the HF semiconductor device 702 is grounded via the inductor 718. An n-type silicon layer of the HF semiconductor device 703 is grounded via the inductor 719.

Hereinbelow, operation of the HF semiconductor circuit according to the sixth embodiment will be described.

Differential signals 1 that have been input to the input nodes P1+ and P1− are amplified by the bipolar transistors 704 and 705. The amplified signals are then output to the bipolar transistors 706 and 709. Differential signals 2 that have been input to the input nodes P2+ and P2− are input to the bipolar transistors 706 to 709. Differential signals having either a sum frequency of the frequency of the differential signals 1 and the frequency of the differential signals 2 or a differential frequency therebetween are enhanced the bipolar transistors 706 to 709, and output from the output nodes P3+ and P3−. According to appropriate setting of the inductor 716 to an appropriate inductance value, common signals that have been input to the input nodes P1+ and P1− are attenuated by the bipolar transistors 704 and 705. The attenuated signals are then input to the bipolar transistors 706 to 709. Thus, the HF semiconductor circuit of the sixth embodiment operates as a differential frequency converter circuit.

In the HF semiconductor circuit of the sixth embodiment, compared to a conventional HF semiconductor circuit, the anti-leakage property is enhanced for preventing the leakage of the differential signals, which have been input to the input nodes P1+ and P1−, to the silicon substrates from wires of the bases of the bipolar transistors 704 and 705. This reduces the loss, thereby improving the noise immunity of the differential frequency converter circuit.

In the HF semiconductor circuit of the sixth embodiment, compared to a prior-art HF semiconductor circuit, the anti-leakage property is enhanced for preventing the leakage of the differential signals, which have been input to the input nodes P2+ and P2−, to the silicon substrates from wires of the bases of the bipolar transistors 706 to 709. This reduces the loss, thereby improving the noise immunity of the differential frequency converter circuit.

Compared to a conventional HF semiconductor circuit, in the sixth embodiment, the anti-leakage property is enhanced for preventing leakage of the differential signals, which have been output from the collectors of the bipolar transistors 706 to 709, to the silicon substrates from wires of the collectors of bipolar transistors 706 to 709 and bonding pads. Thereby, the loss is reduced. Consequently, the output power loss of the differential frequency converter circuit can be reduced.

In the HF semiconductor circuit of the sixth embodiment, electric charge does not accumulate in the n-type silicon layers of the HF semiconductor devices 701, 702, and 703; and the direct-current potentials in the n-type silicon layers are individually fixed to ground potentials.

In the HF semiconductor circuit of the sixth embodiment, the n-type silicon layers of the HF semiconductor devices 701, 702, and 703 are connected to one another via the inductors 717, 718 and 719 and the ground. This arrangement improves in isolation among the input nodes P1+ and P1−, the input nodes P2+ and P2−, and the output nodes P3+ and P3−.

According to the sixth embodiment, one of the HF semiconductor devices of the first through the third embodiments is used for each of input and output sections of the differential frequency converter circuit. As such, the n-type silicon layers of the HF semiconductor devices are connected to the input and output of the differential amplifier circuit via the inductors. This arrangement improves the noise immunity of the differential amplifier circuit. Thereby, the output power loss in the differential frequency converter circuit is reduced, and the isolation among the individual input and output nodes is improved.

The configuration may be modified such that the inductors 717 to 719 are removed, and the n-type silicon layers of the HF semiconductor devices 701 to 703 according to the first through the third embodiments are individually covered by an insulator made of, for example, a silicon oxide film.

A MIM capacitor and a MOS capacitor may be in parallel connected to the inductors 717 to 719. In this case, the resonant frequencies of the inductors and capacitors are preferably in the same frequency bands of signals flowing through the first and second wires.

The configuration may use resistors formed of, for example, doped polysilicon, to replace the inductors 717 to 719. Alternatively, the inductors 717 to 719 may be each replaced by a distributed-constant line that is formed of, for example, a metal wire and that has a line-length equivalent to an odd multiple of one quarter of a wavelength of the signal. Still alternatively, the inductors 717 to 719 may be each replaced by an inductor formed of a rewiring layer of a chip size package (CSP). Yet alternatively, the inductors 717 to 719 may be each replaced by an inductor built in a laminated substrate.

(Seventh Embodiment)

Figure 12:
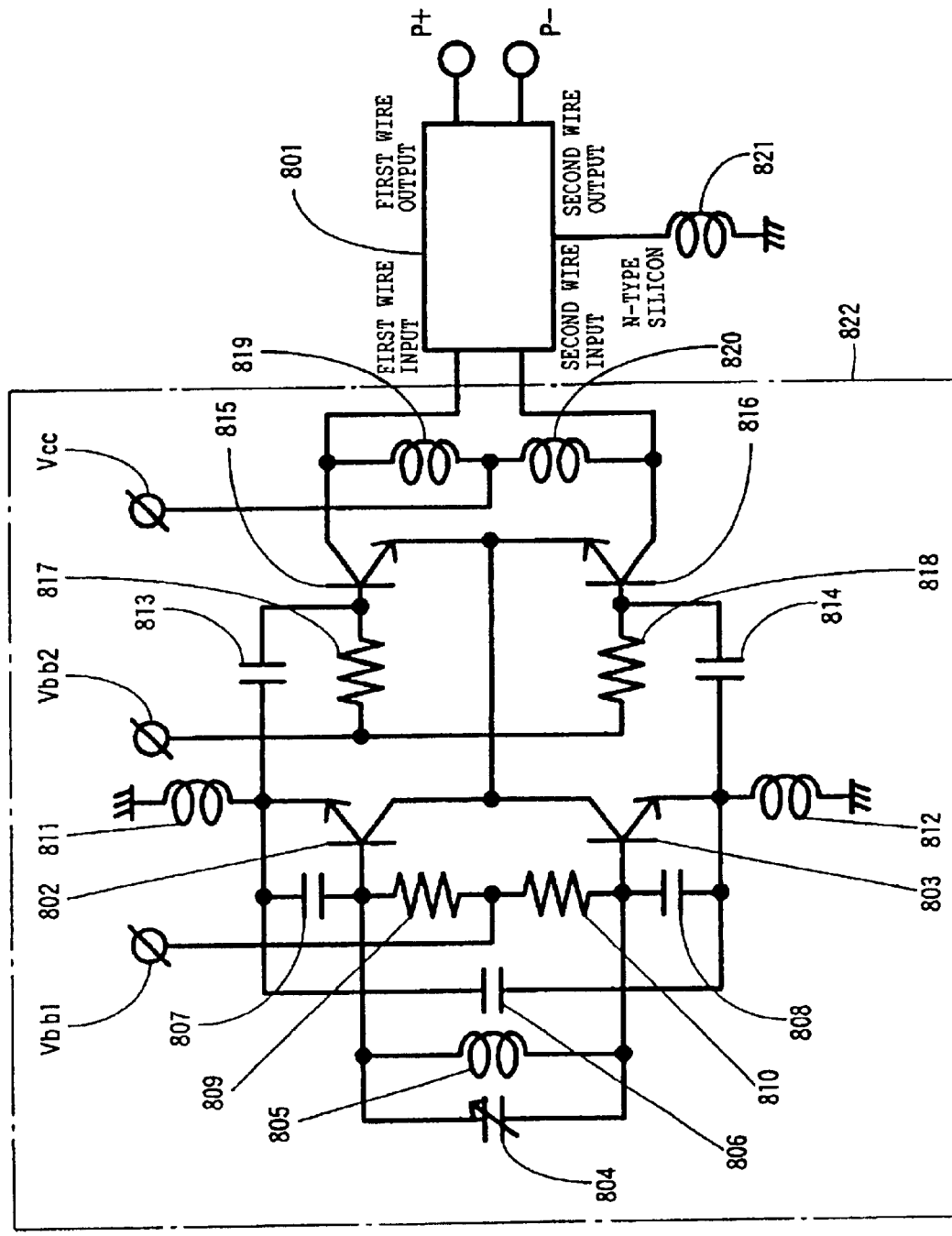
FIG. 12 is a circuit diagram of an HF semiconductor device according to a seventh preferable embodiment of the present invention.

Hereinbelow, an example configuration of an HF semiconductor circuit according to a seventh embodiment will be described with reference to FIG. 12. Numeral 801 denotes one of the HF semiconductor devices according to the first through the third embodiments. Numerals 802, 803, 814, and 815 each denote a bipolar transistor. Numeral 804 denotes a varactor diode. Numerals 805, 811, 812, 819, 820, and 821 each denote an inductor formed of, for example, a spiral wire formed of a metal film such as an Al or Cu film. Numerals 806, 807, 808, 813, and 814 each denote a capacitor. Numerals 809, 810, 817, and 818 each denote a resistor. These circuit elements configure an example of an oscillator circuit section 820.

The varactor diode 804 and the inductor 805 are in parallel connected. Two ends of each of the varactor diode 804 and the inductor 805 are connected to the bases of the bipolar transistors 802 and 803. The capacitor 806 is inserted between the emitters of the bipolar transistors 802 and 803. The capacitor 807 is inserted between the emitter and the base of the bipolar transistor 802. The capacitor 807 is inserted between the emitter and the base of the bipolar transistor 802. The capacitor 808 is inserted between the emitter and the base of the bipolar transistor 803. The emitter of the bipolar transistor 802 is connected to the base of the bipolar transistor 815 via the capacitor 813. The emitter of the bipolar transistor 803 is connected to the base of the bipolar transistor 816 via the capacitor 814. The collectors of the bipolar transistors 802 and 803 are connected to first and second wire inputs of the HF semiconductor device 801, respectively. First and second wire outputs of the HF semiconductor device 801 are connected to output nodes P+ and P− of the HF semiconductor device 801. All the collectors of the bipolar transistors 802 and 803 and emitters of the capacitors 814 and 815 are connected to one another. The emitters of the bipolar transistors 802 and 803 are grounded via the respective inductors 811 and 812. A bias voltage Vbb1 is connected to the bases of the bipolar transistors 802 and 803 via the respective resistors 809 and 810. A bias voltage Vbb2 is connected to the bases of the capacitors 814 and 815 via the respective resistors 817 and 818. A power voltage Vcc is connected to the collectors of the capacitors 814 and 815 via the respective inductors 819 and 820. An n-type silicon layer of the HF semiconductor device 801 is grounded via the inductor 821.

Hereinbelow, operation of the HF semiconductor circuit according to the seventh embodiment will be described.

The varactor diode 804, the inductor 805, and the capacitors 806 and 808 form a resonator circuit. Parts of signals that were amplified by the bipolar transistors 802 and 803 and that have been output toward the emitter are input to the resonator circuit. Only specific frequency components of the signals are positively fed back to the bases of the bipolar transistors 802 and 803.

The HF semiconductor circuit of the seventh embodiment operates as a differential oscillator circuit. The parts of the signal that have been output to the emitters of the bipolar transistor 802 and 803 are further amplified by the bipolar transistor 815 and 816. The amplified signals are then output to the o output nodes P+ and P−.

In the HF semiconductor circuit of the seventh embodiment, compared to a conventional HF semiconductor circuit, the anti-leakage property is enhanced for preventing the leakage of the differential signals, which have been input to the input nodes P1+ and P1−, to the silicon substrates from wires. This reduces the loss, thereby improving the noise immunity of the differential oscillator circuit.

Compared to a conventional HF semiconductor circuit, the HF semiconductor circuit of the seventh embodiment facilitates the attenuation in the HF semiconductor device 801 for the common signal component that has been output from the differential oscillator circuit. This enables the implementation of the differential oscillator circuit that has a high resistance to disturbances.

In the HF semiconductor circuit of the seventh embodiment, electric current is shared by the bipolar transistors 802 and 803 as a differential oscillator circuit and the bipolar transistors 815 and 816 as a buffer amplifier circuit. Thereby, the low-current-consumption oscillator circuit is implemented.

The seventh embodiment uses one of the HF semiconductor devices according to the first through the third embodiments for the output section of the differential oscillator circuit. As such, by grounding the n-type silicon layer of the HF semiconductor device via the inductor, the low-noise differential oscillator circuit that has a high resistance to disturbances can be implemented.

(Eighth Embodiment)

Figure 13:
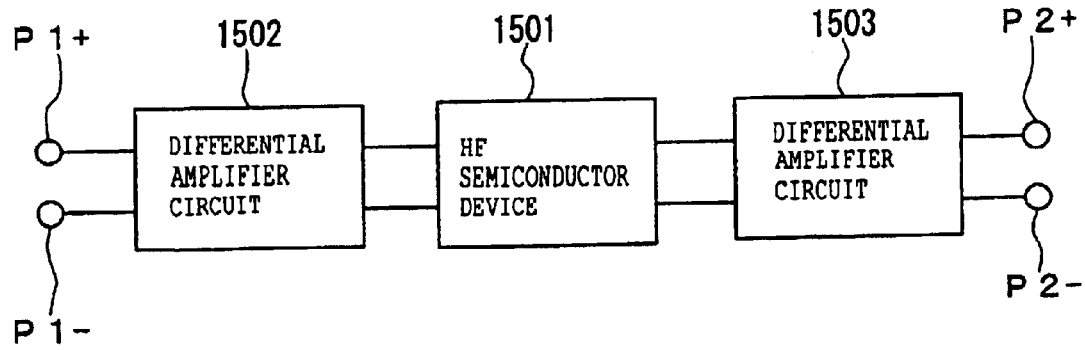
FIG. 13 is a circuit diagram of an HF semiconductor device according to an eighth preferable embodiment of the present invention.

Hereinbelow, an example configuration of an HF semiconductor circuit according to an eighth embodiment will be described with reference to FIG. 13. Numeral 1501 denotes one of the HF semiconductor devices according to the first to third embodiments, numeral 1502 denotes a differential amplifier circuit, and numeral 1503 denotes a differential frequency converter circuit. Input nodes P1+ and P1− are connected to inputs of the first differential amplifier circuit 1502. Outputs of the first differential amplifier circuit 1502 are connected to the HF semiconductor device 1501. Outputs of the HF semiconductor device 1501 are connected to inputs of the second differential amplifier circuit 1503. Outputs of the second differential amplifier circuit 1503 are connected to input nodes P2+ and P2−.

Compared to the prior-art HF semiconductor device, the HF semiconductor circuit of the eighth embodiment reduces the loss attributable to leakage of differential signals from wires between the first differential amplifier circuit 1502 and the second differential amplifier circuit 1503.

According to the eighth embodiment, since one of the HF semiconductor devices of the first to third embodiments is used for a wire connecting a plurality of wires, the loss attributable to leakage of differential signals is reduced.

(Ninth Embodiment)

Figure 14A:
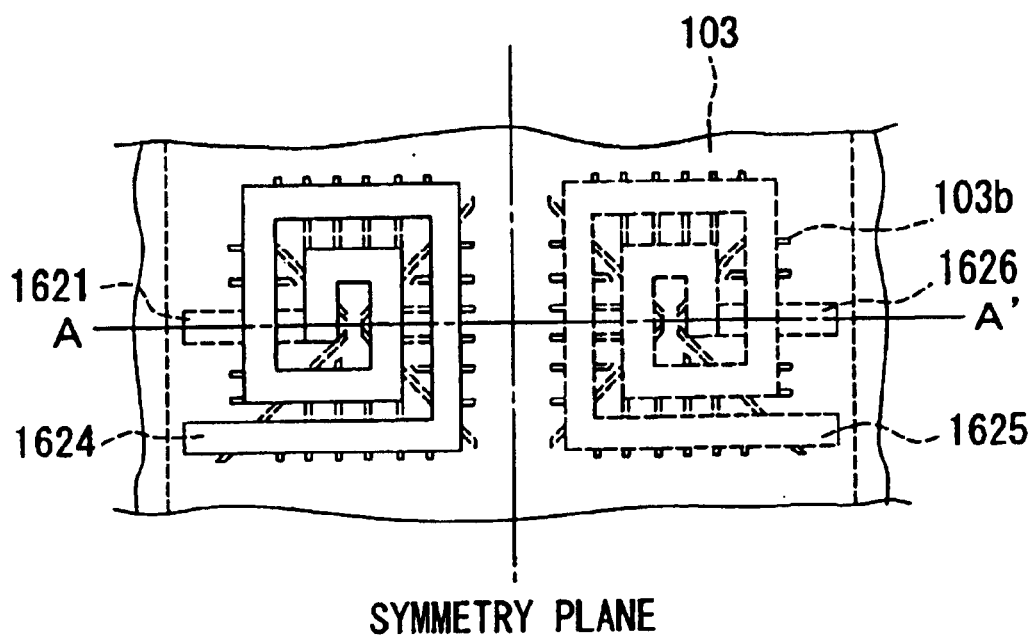
FIG. 14A is a circuit diagram of an HF semiconductor device according to a ninth preferable embodiment of the present invention.
Figure 14B:
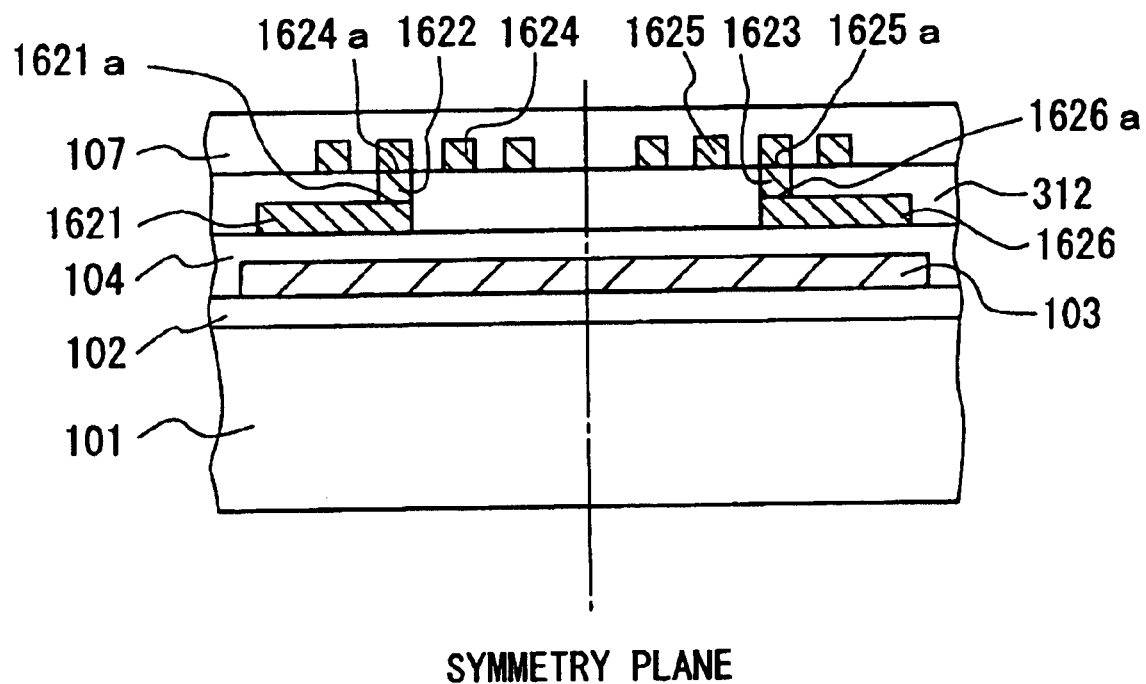
FIG. 14B is a cross sectional view along the line A–A' of FIG. 14A.

Hereinbelow, an example configuration of an HF semiconductor device according to a ninth embodiment will be described with reference to FIGS. 14A and 14B. A lower insulator layer 102 covers the surface of a p-type silicon substrate 101 (semiconductor substrate). An n-type silicon layer 103 is formed on the surface of the lower insulator layer 102. An upper insulator layer 104 covers the surface of the n-type silicon layer 103. Leader wires 1621 and 1626 each formed of, for example, an Al or Cu metal film, is formed on the surface of the upper insulator layer 104. A third insulator layer 312 covers the surface of the leader wires 1621 and 1626 with terminal portions 1621a and 1626a remaining not covered. Plugs 1622 and 1623 formed of a material such as tungsten are buried in portions on the terminal portions 1621a and 1626a, respectively. First and second spiral wires 1624 and 1625 are formed on the surface of the third insulator layer 312. The first and second spiral wires 1624 and 1625 are formed of, for example, an Al or Cu metal film, and individually form inductors. A protection layer 107 is formed on the surfaces of the first and second spiral wires 1624 and 1625. The p-type silicon substrate 101 is connected to a ground (not shown). The n-type silicon layer 103 and the first and second spiral wires 1624 and 1625 are formed to be peripherally symmetric with respect to a symmetry plane in FIGS. 14A and 14B.

Inner terminals 1624a and 1625a are provided at inner peripheral ends of the respective first and second spiral wires 1624 and 1625. The inner terminals 1624a and 1625a are connected to the terminal portions 1621a and 1626a of the leader wire 1621 via the respective plugs 1622 and 1623. Cutouts 103b are formed in the n-type silicon layer 103. A certain number of the cutouts 103b are formed radially from the center of each of the first and second spiral wires 1624 and 1625. The other cutouts 103b are formed perpendicular to one another.

In the above-described configuration, the lower insulator layer 102 electrically isolates the n-type silicon layer 103 (electroconductor layer) from the p-type silicon substrate 101. The lower insulator layer 102 forms a first insulator layer. The lower insulator layer 102 and the upper insulator layer 104 electrically insulate the first and second spiral wires 1624 and 1625 from the n-type silicon layer 103 (electroconductor layer) and the p-type silicon substrate 101. Thus, the upper insulator layer 104 and the lower insulator layer 102 form a second insulator layer.

In the HF semiconductor device of the ninth embodiment, as in the configuration shown in FIGS. 1A and 1B, differential signals leaked from the ungrounded first and second spiral wires 1624 and 1625 to the n-type silicon layer 103 flows to a virtual ground. Since the n-type silicon layer 103 is isolated by the third resistor layer 312 from the ground, common signals leaked from the first spiral wire 1624 and the second spiral wire 1625 flow to the p-type silicon substrate 101. As such, the common signals are attenuated by a resistance component of the p-type silicon substrate 101.

Compared to the prior-art HF semiconductor device, the HF semiconductor device of the ninth embodiment exhibits a high anti-leakage property for preventing the signals from leaking from the spiral wires to the silicon substrate. Consequently, the loss is reduced by a reduction in leakage of the signals.

In addition, an overcurrent-attributed loss in the n-type silicon layer 103 is reduced because of the radial cutouts 103b formed in the n-type silicon layer 103.

The radial cutouts 103b formed in the n-type silicon layer 103 below the differential on-chip inductors function to reduce the loss occurring because of signal leakage to the silicon substrate as well as the loss occurring because of overcurrent in the n-type silicon layer. That is, in the ninth embodiment, the low-loss differential on-chip inductors are implemented.

The forming positions of the n-type silicon layer 103 and the first and second spiral wires 1624 and 1625 may be vertically reversed. In this case, advantages similar to those in the above-described example configuration can be obtained by forming the n-type silicon layer 103 in the vicinities of the first and second spiral wires 1624 and 1625. A reason for the above is that electrofields of HF signals flowing to the first and second spiral wires 1624 and 1625 concentrate in the n-type silicon layer 103, thereby reducing the leakage to the p-type silicon substrate 101.

The ninth embodiment may employ the configuration shown in FIG. 6. That is, advantages similar to those described above can be obtained by disposing the first and second electroconductor layers 1811 and 1812 in the vicinities of the first and second spiral wires 1624 and 1625.

The ninth embodiment may be configured using three or four phase wires. In a configuration using three phase wires, signals that are each out of phase in units of 120 degree are fed to flow therethrough. In a configuration using four phase wires, signals that are each out of phase in units of 90 degree are fed to flow therethrough. Thereby, advantages similar to those described above can be obtained.

The ninth embodiment may be arranged such that an common signal and an differential signal are alternately fed to three or more wires. In the ninth embodiment, differential signals, common signals, or signals with equally different phases may preferably be fed to flow through the plurality of wires. However, similar advantages can even be obtained with out-of-phase signals being fed to flow through the wires. In the configuration of the present invention, the out-of-phase signal is considered to be a composite signal of a high common signal and a low differential signal. As such, on one hand, an common component is attenuated by a resistance component of the p-type silicon substrate 101. On the other hand, the loss of an differential component is reduced by a resistance component of the p-type silicon substrate 101.

The n-type silicon layer 103 may be replaced by a wire formed of, for example, highly doped p-type silicon or an Al or Cu metal film.

The present embodiment may be implemented even in a configuration not including the lower insulator layer 102. In the configuration, a depletion layer occurring with a p-n junction of the n-type silicon layer 103 and the p-type silicon substrate 101 functions similar to the lower insulator layer 102.

The n-type silicon layer 103 may be grounded via an inductor in the form of, for example, a spiral wire formed of a metal film such as an Al or Cu film. A MIM capacitor or a MOS capacitor may be in parallel connected to the inductor. In this case, the resonant frequencies of the inductor and capacitor are preferably in the same frequency bands of signals flowing through the first and second wires.

The n-type silicon layer 103 may be grounded via a resistor formed of, for example, doped polysilicon. Alternatively, the n-type silicon layer 103 may be grounded via a distributed-constant line that is formed of, for example, a metal wire and that has a line-length equivalent to a line-length equivalent to an odd multiple of one quarter of a wavelength of the signal. The inductor 821 may be replaced by an inductor formed of a rewiring layer of a chip size package (CSP). Yet alternatively, the inductor 821 may be replaced by an inductor built in a laminated substrate.

(Tenth Embodiment)

Figure 15A:
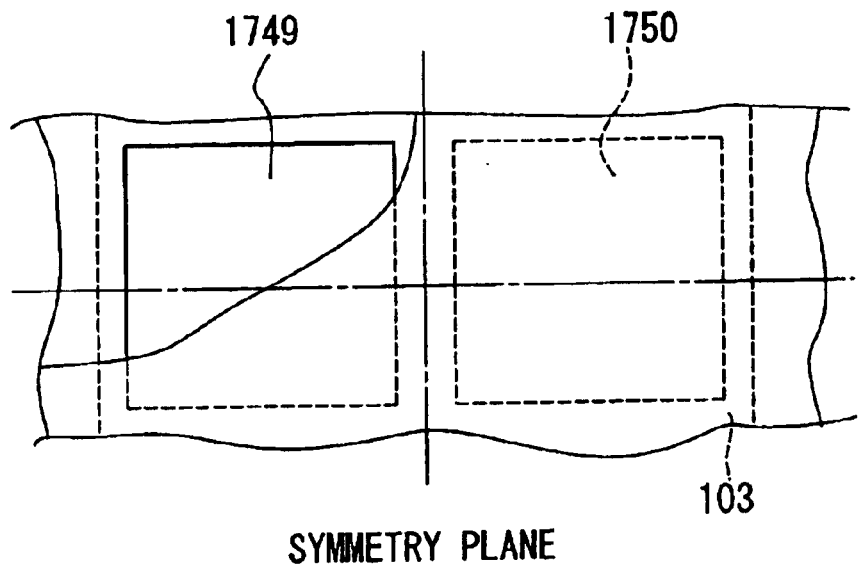
FIG. 15A is an explanatory plan view of an example configuration of an HF semiconductor device according to a tenth preferred embodiment of the present invention.
Figure 15B:
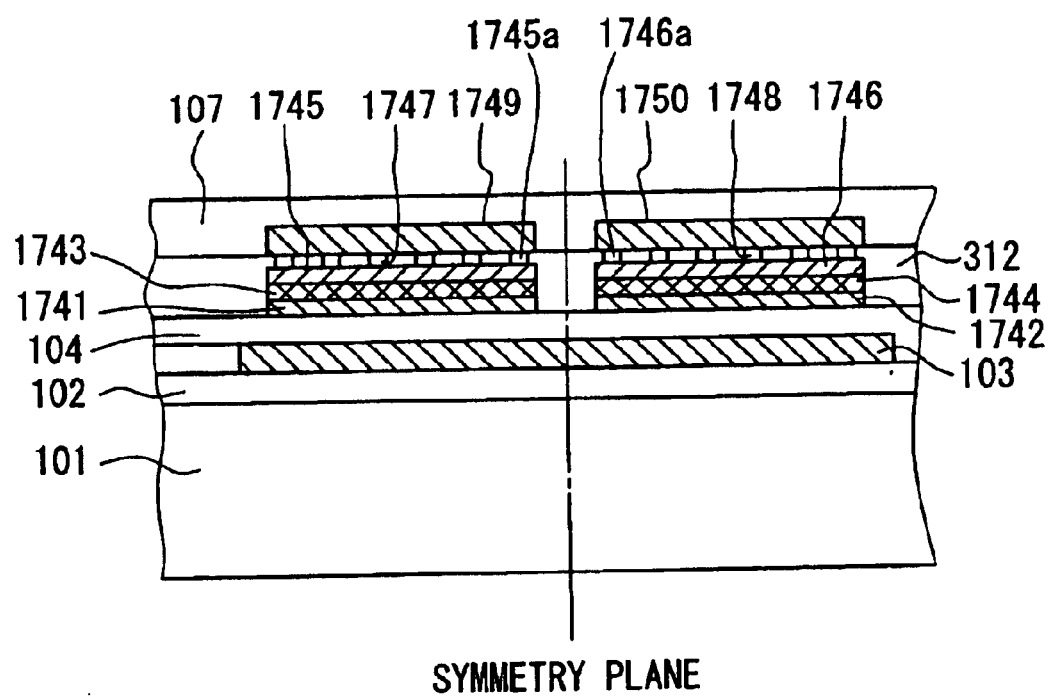
FIG. 15B is a cross sectional view along the line A–A' of FIG. 15A.
Figure 16A:
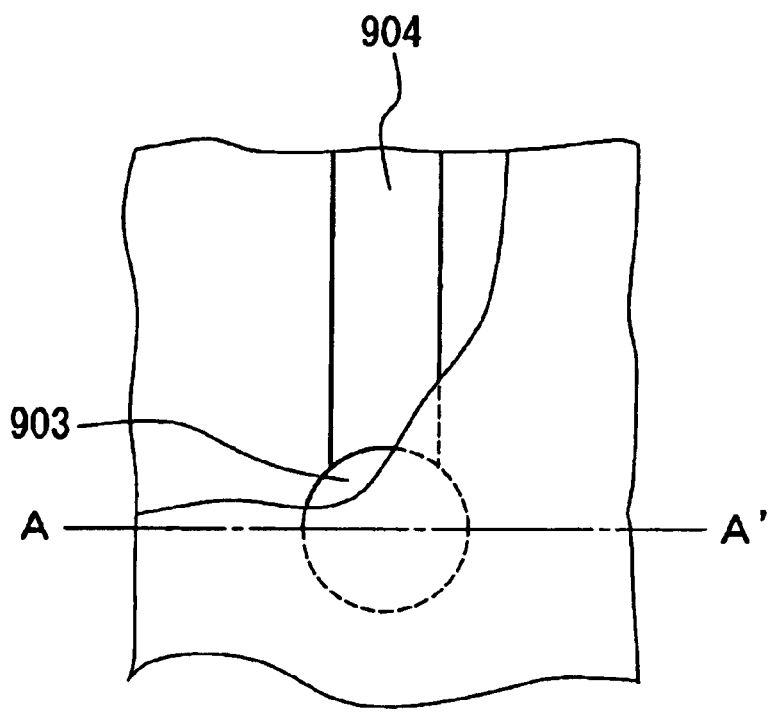
FIG. 16A is a plan view of an example configuration of a prior-art HF semiconductor device.
Figure 16B:
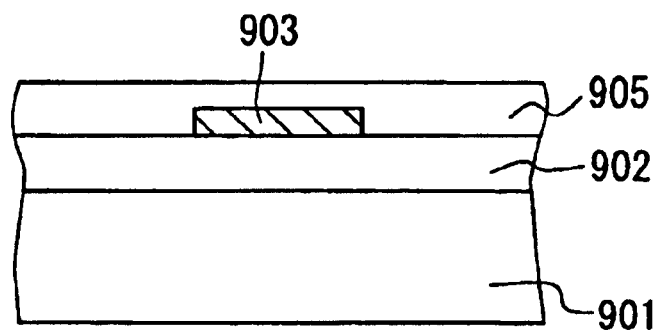
FIG. 16B is a cross sectional view along the line A–A' of FIG. 16A.
Figure 17A:
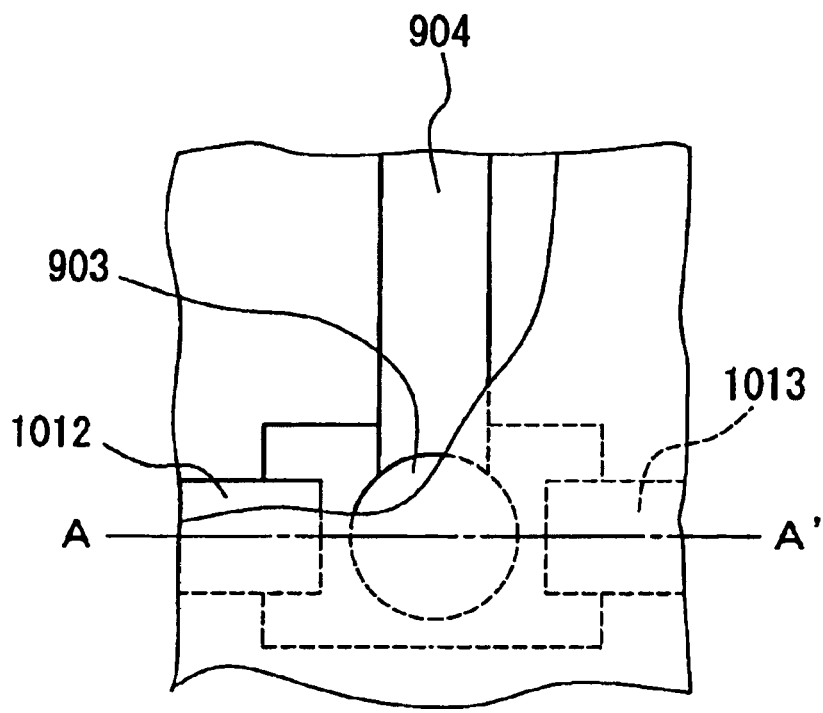
FIG. 17A is a plan view of an example configuration of another prior-art HF semiconductor device.
Figure 17B:
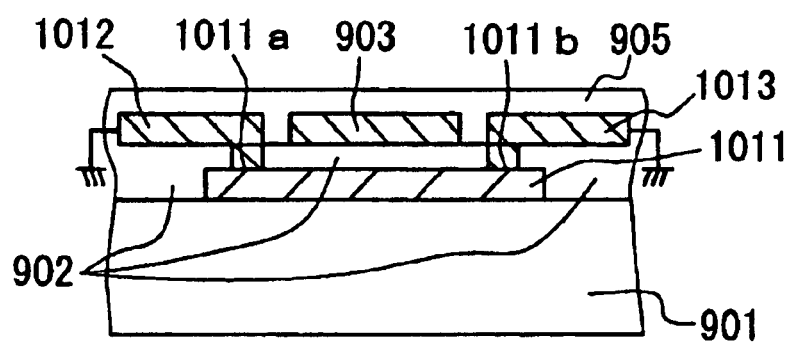
FIG. 17B is a cross sectional view along the line A–A' of FIG. 17A.
Figure 18:
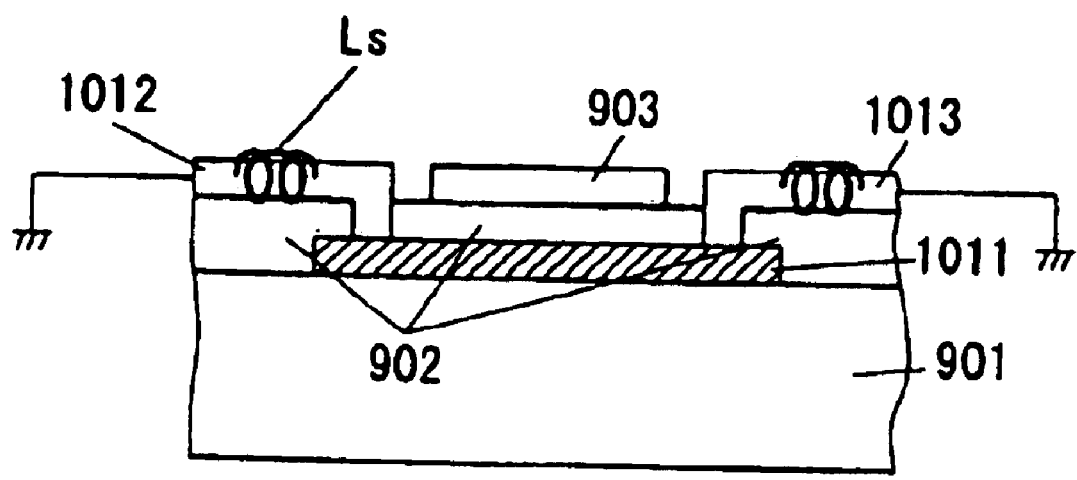
FIG. 18 is a cross sectional view showing problems with the HF semiconductor device shown in FIGS. 17A and 17B.

Hereinbelow, an example configuration of an HF semiconductor device according to a tenth embodiment will be described with reference to FIGS. 15A and 15B. A lower insulator layer 102 covers the surface of a p-type silicon substrate 101 (semiconductor substrate). An n-type silicon layer 103 is formed on the surface of the lower insulator layer 102. An upper insulator layer 104 covers the surface of the n-type silicon layer 103. Electrode plates 1741 and 1742 each formed of, for example, an Al or Cu metal film, is formed on the surface of the upper insulator layer 104. Lower electrode plates 1741 and 1742 each formed of a metal film such as an Al or Cu film are formed on the surface of the upper insulator layer 104. Dielectric layers 1743 and 1744 formed of a material such as a $SiO_2$ or SiN are formed over the electrode plates 1741 and 1742. Upper electrode plates 1745 and 1746 formed of a metal film such as an Al or Cu film are formed over the dielectric layers 1743 and 1744. A third resistor layer 312 covers the surfaces of the upper electrode plates 1745 and 1746 with terminal portions 1745a and 1746a remaining not covered. Plugs 1747 and 1748 formed of a material such as tungsten are buried in portions on the terminal portions 1745a and 1746a, respectively. Wires 1749 and 1750 formed of metal film such as an Al or Cu film are formed on the surface of the third insulator layer 312. A protection layer 107 is formed on the surfaces of the wires 1749 and 1750. The p-type silicon substrate 101 is connected to a ground (not shown). The n-type silicon layer 103, the electrode plates 1741 and 1742, the dielectric layers 1743 and 1744, and the upper electrode plates 1745 and 1746 are formed to be peripherally symmetric with respect to a symmetry plane in FIGS. 15A and 15B.

In the above-described configuration, the lower insulator layer 102 forms a first insulator layer, and the upper insulator layer 104 forms a second insulator layer. The electrode plates 1741 and 1742 form a first wire, and the upper electrode plates 1745 and 1746 form a second wire.

In the HF semiconductor device of the tenth embodiment, as in the configuration shown in FIGS. 1A and 1B, differential signals leaked from the ungrounded electrode plates 1741 and 1742 to the n-type silicon layer 103 flows to a virtual ground. Since the n-type silicon layer 103 is isolated by the third resistor layer 312 from the ground, common signals leaked from the electrode plates 1741 and 1742 flow to the p-type silicon substrate 101. As such, the common signals are attenuated by a resistance component of the p-type silicon substrate 101.

Compared to the prior-art HF semiconductor device, in the HF semiconductor device of the tenth embodiment, the loss can be reduced that occurs because of signal leakage from a lower electrode of on-chip capacitors to the silicon substrate.

In the tenth embodiment, the n-type silicon layer 103 is formed below the differential on-chip capacitors. This implements differential on-chip capacitors with a function of reducing the loss that occurs because of signal leakage to the n-type silicon layer 103.

The tenth embodiment may be configured using three or four phase wires. In a configuration using three phase wires, signals that are each out of phase in units of 120 degree are fed to flow therethrough. In a configuration using four phase wires, signals that are each out of phase in units of 90 degree are fed to flow therethrough. Thereby, advantages similar to those described above can be obtained.

The tenth embodiment may be arranged such that an common signal and an differential signal are alternately fed to three or more wires.

In the tenth embodiment, differential signals, common signals, or signals with equally different phases may preferably be fed to flow through the plurality of wires. However, similar advantages can even be obtained with out-of-phase signals being fed to flow through the wires. In the configuration of the present invention, the out-of-phase signal is considered to be a composite signal of a high common signal and a low differential signal. As such, on one hand, an common component is attenuated by a resistance component of the p-type silicon substrate 101. On the other hand, the loss of an differential component is reduced by a resistance component of the p-type silicon substrate 101.

The n-type silicon layer 103 may be replaced by a wire formed of, for example, highly doped p-type silicon or an Al or Cu metal film.

The present embodiment may be implemented even in a configuration not including the lower insulator layer 102. In the configuration, a depletion layer occurring with a p-n junction of the n-type silicon layer 103 and the p-type silicon substrate 101 functions similar to the lower insulator layer 102.

The n-type silicon layer 103 may be grounded via an inductor in the form of, for example, a spiral wire formed of a metal film such as an Al or Cu film. A MIM capacitor or a MOS capacitor may be in parallel connected to the inductor. In this case, the resonant frequencies of the inductor and capacitor are preferably in the same frequency bands of signals flowing through the first and second wires.

The n-type silicon layer 103 may be grounded via a resistor formed of, for example, doped polysilicon. Alternatively, the n-type silicon layer 103 may be grounded via a distributed-constant line that is formed of, for example, a metal wire and that has a line-length equivalent to an odd multiple of one quarter of a wavelength of the signal. The inductor 821 may be replaced by an inductor formed of a rewiring layer of a chip size package (CSP). Yet alternatively, the inductor 821 may be replaced by an inductor built in a laminated substrate.

While there has been described what is at present considered to be preferred embodiments of the present invention, it will be understood that various modifications may made therein, and it is intended to cover in the appended claims all such modifications as fall within the true spirit and scope of the present invention.

What is claimed is:

1. A high frequency HF semiconductor device comprising:
   a semiconductor substrate;
   an electroconductor layer provided on the semiconductor substrate;
   a first insulator layer for electrically insulating the electroconductor layer from the semiconductor substrate;
   N pieces of wires which are provided on the semiconductor substrate, each of said N pieces of wires having one of N-phase signals coupled thereto where N represents a positive integer equal to or greater than 2;
   a second insulator layer for electrically insulating the wires from the electroconductor layer and the semiconductor substrate;
   wherein $N_1$ pieces of the wires are provided on one side of the electroconductor layer where $N_1$ represents 0 or a positive integer equaling or less than N and $N_2$ pieces of the wires are provided on the other side of the electroconductor layer where $N_2$ represents 0 or a positive integer satisfying $N_1+N_2=N$.

2. An HF semiconductor device according to claim 1, wherein the wires are disposed such that a surface of each of said N pieces of wire faces a surface of the electroconductor layer.

3. An HF semiconductor device according to claim 1, further comprising an HF-signal isolating section provided between the electroconductor layer and a ground to isolate an HF component flowing between the electroconductor layer and the ground.

4. An HF semiconductor device according to claim 3, wherein the HF-signal isolating section is an insulator.

5. An HF semiconductor device according to claim 3, wherein the HF-signal isolating section is a resistor.

6. An HF semiconductor device according to claim 3, wherein the HF-signal isolating section is an inductor.

7. An HF semiconductor device according to claim 3, wherein the HF-signal isolating section is formed such that an inductor and a capacitor are connected in parallel and a resonant frequency of the HF-signal isolating section is in the same frequency band of the signal fed to the wire.

8. An HF semiconductor device according to claim 3, wherein the HF-signal isolating section is a distributed-constant line having a line-length equivalent to an odd multiple of one quarter of a wavelength of the signal fed to the wire.

9. An HF semiconductor device according to claim 1, wherein the electroconductor layer is formed of one of metal, p-type doped polysilicon, and n-type doped polysilicon.

10. An HF semiconductor device according to claim 1, wherein the electroconductor layer is an electroconductive silicon layer that is different from the semiconductor substrate.

11. An HF semiconductor device according to claim 1, wherein an inductor is connected between the wires.

12. An HF semiconductor circuit comprising a plurality of the HF semiconductor devices according to claim 3, wherein the electroconductor layers of the individual HF semiconductor devices are connected to one another via the HF-signal isolating section provided to isolate the HF component flowing between the electroconductor layer and the ground.

13. An HF semiconductor circuit comprising;
at least two units of the HF semiconductor devices according to claim 1, and a switch circuit section,
wherein the HF semiconductor devices are connected via the switch circuit section; and the switch circuit section performs control electrically isolating the HF semiconductor devices from each other according to a control voltage.

14. An HF semiconductor circuit comprising;
at least two units of the HF semiconductor devices according to claim 1, and an amplifying circuit section,
wherein the HF semiconductor devices are connected via the amplifying circuit section; and
the amplifying circuit section amplifies a signal inputted from the one HF semiconductor device and outputs the signal to the other HF semiconductor device.

15. An HF semiconductor circuit comprising;
at least three units of the HF semiconductor devices according to claim 1, and a frequency converter circuit section;
wherein the HF semiconductor devices are connected to the frequency converter circuit section; and
the frequency converter circuit section performs a frequency conversion of an input signal inputted from each of the two HF semiconductor devices and outputs the signal to the other HF semiconductor devices.

16. An HF semiconductor circuit comprising:
the HF semiconductor device according to claim 1, and an oscillator circuit connected to the HF semiconductor device.

17. An HF semiconductor device comprising:
a semiconductor substrate;
an electroconductor layer provided on the semiconductor substrate;
a first insulator layer for electrically insulating the electroconductor layer from the semiconductor substrate;
a spiral wire provided on the semiconductor substrate opposite to the electroconductor layer;
a second insulator layer for electrically insulating the spiral wire from the electroconductor layer and the semiconductor substrate;
an HF-signal isolating section provided between the electroconductor layer and a ground potential to isolate an HF component flowing between the electroconductor layer and the ground potential; and
wherein cutouts are provided in positions of the electroconductor layer opposite to the spiral wire, and the cutouts are provided to radially extend from a position opposite to the spiral wire as a center.

18. An HF semiconductor device according to claim 17, wherein the HF-signal isolating section is an insulator.

19. An HF semiconductor device according to claim 17, wherein the HF-signal isolating section is a resistor.

20. An HF semiconductor device according to claim 17, wherein the HF-signal isolating section is an inductor.

21. An HF semiconductor device according to claim 17, wherein
the HF-signal isolating section is formed such that an inductor and a capacitor are connected in parallel; and
a resonant frequency of the HF-signal isolating section is in the same frequency band of the signal fed to the spiral wire.

22. An HF semiconductor device according to claim 17, wherein the HF-signal isolating section is a distributed-constant line having a line-length equivalent to an odd multiple of one quarter of a wavelength of the signal fed to the spiral wire.

23. An HF semiconductor device according to claim 17, wherein the electroconductor layer is formed of one of metal, p-type doped polysilicon, and n-type doped polysilicon.

24. An HF semiconductor device according to claim 17, wherein the electroconductor layer is an electroconductive silicon layer that is different from the semiconductor substrate.

25. An HF semiconductor device comprising:
a semiconductor substrate;
a first insulator layer provided on the semiconductor substrate;
an electroconductor layer provided on the first insulator layer;
a second insulator layer provided on the electroconductor layer;
a first wire provided on the second insulator layer opposite to the electroconductor layer;
a dielectric layer provided on the first wire;
a second wire provided on the dielectric layer opposite to the first wire; and
an HF-signal isolating section provided between the electroconductor layer and a ground to isolate an HF component flowing between the electroconductor layer and the ground.

26. An HF semiconductor device according to claim 25, wherein the HF-signal isolating section is an insulator.

27. An HF semiconductor device according to claim 25, wherein the HF-signal isolating section is a resistor.

28. An HF semiconductor device according to claim 25, wherein the HF-signal isolating section is an inductor.

29. An HF semiconductor device according to claim 25, wherein:
the HF-signal isolating section is formed such that an inductor and a capacitor are connected in parallel; and
a resonant frequency of the HF-signal isolating section is in the same frequency band of the signal fed to one of the first to fourth wires.

30. An HF semiconductor device according to claim 25, wherein the HF-signal isolating section is a distributed-constant line having a line-length equivalent to an odd multiple of one quarter of a wavelength of the signal fed to one of the first to fourth wire.

31. An HF semiconductor device according to claim 25, wherein the electroconductor layer is formed of one of metal, p-type doped polysilicon, and n-type doped polysilicon.

32. An HF semiconductor device according to claim 25, wherein the electroconductor layer is an electroconductive silicon layer that is different from the semiconductor substrate.

33. An HF semiconductor device according to claim 1, wherein said N pieces of wire are disposed symmetrically relative to a center axis of said electroconductive layer.

34. An HF semiconductor device according to claim 1, wherein said N pieces of wire are not directly coupled to said electroconductive layer.

* * * * *